(12) United States Patent
Schloesser

(10) Patent No.: US 7,956,387 B2
(45) Date of Patent: Jun. 7, 2011

(54) TRANSISTOR AND MEMORY CELL ARRAY

(75) Inventor: Till Schloesser, Dresden (DE)

(73) Assignee: Qimonda AG, Munich (DE)

( * ) Notice: Subject to any disclaimer, the term of this patent is extended or adjusted under 35 U.S.C. 154(b) by 618 days.

(21) Appl. No.: 11/517,558

(22) Filed: Sep. 8, 2006

(65) Prior Publication Data
US 2008/0121961 A1 May 29, 2008

(51) Int. Cl.
H01L 26/66 (2006.01)
H01L 21/02 (2006.01)

(52) U.S. Cl. ............. 257/220; 257/242; 257/E27.06; 438/272; 438/282

(58) Field of Classification Search .......... 257/302, 257/220, 242, E27.06; 438/282, 272
See application file for complete search history.

(56) References Cited

U.S. PATENT DOCUMENTS

| | | | | |
|---|---|---|---|---|
| 4,453,305 A * | 6/1984 | Janes et al. | | 438/282 |
| 4,908,332 A * | 3/1990 | Wu | | 438/297 |
| 4,954,854 A * | 9/1990 | Dhong et al. | | 257/332 |
| 4,996,574 A | 2/1991 | Shirasaki | | |
| 5,502,320 A | 3/1996 | Yamada | | |
| 6,063,669 A | 5/2000 | Takaishi | | |
| 6,555,872 B1 * | 4/2003 | Dennen | | 257/327 |
| 7,034,408 B1 | 4/2006 | Schloesser | | |
| 2002/0036290 A1 | 3/2002 | Inaba et al. | | |
| 2005/0199920 A1 | 9/2005 | Lee et al. | | |
| 2005/0263821 A1 | 12/2005 | Cho et al. | | |
| 2005/0285153 A1 * | 12/2005 | Weis et al. | | 257/232 |
| 2006/0110884 A1 | 5/2006 | Wang et al. | | |
| 2006/0120129 A1 | 6/2006 | Schloesser | | |
| 2006/0281250 A1 | 12/2006 | Schloesser | | |

FOREIGN PATENT DOCUMENTS

EP 1003219 A2 6/2001
WO WO 01/01489 A1 1/2001

OTHER PUBLICATIONS

U.S. Appl. No. 11/118,768, Dirk Manger, et al.
Office Action issued by the Korean Patent Office in counterpart Korean Patent Application No. 2007-0090406, dated Jun. 22, 2009, along with an English translation.

* cited by examiner

Primary Examiner — Kiesha R Bryant
Assistant Examiner — Tucker Wright
(74) Attorney, Agent, or Firm — Edell, Shapiro & Finnan, LLC

(57) ABSTRACT

A transistor, which is formed in a semiconductor substrate having a top surface, includes first and second source/drain regions, a channel connecting the first and second source/drain regions, and a gate electrode for controlling an electrical current flowing in the channel. The gate electrode is disposed in a lower portion of a gate groove defined in the top surface of the semiconductor substrate. The upper portion of the groove is filled with an insulating material. The channel includes a fin-like portion in the shape of a ridge having a top side and two lateral sides in a cross-section perpendicular to a direction defined by a line connecting the first and second source/drain regions. The gate electrode encloses the channel at the top side and the two lateral sides thereof.

14 Claims, 25 Drawing Sheets

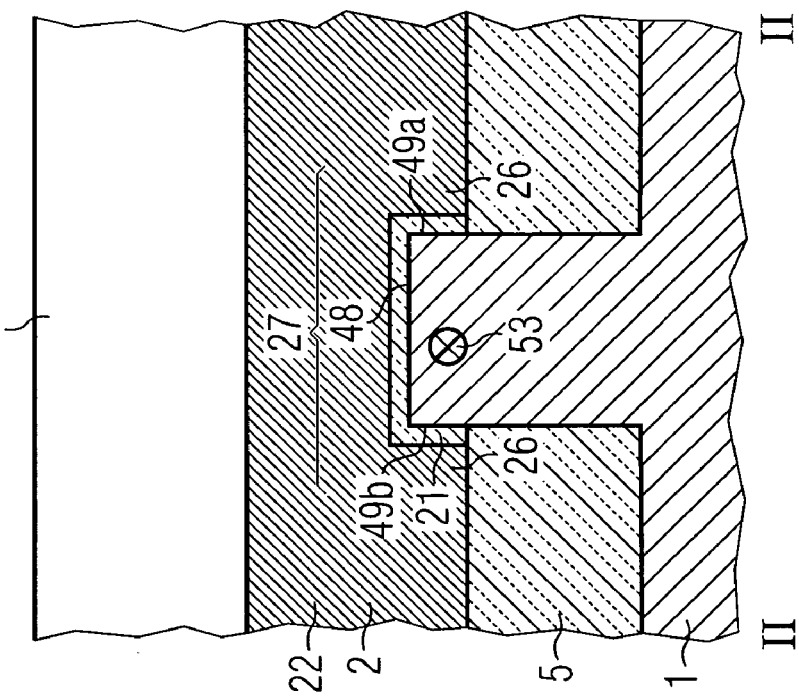
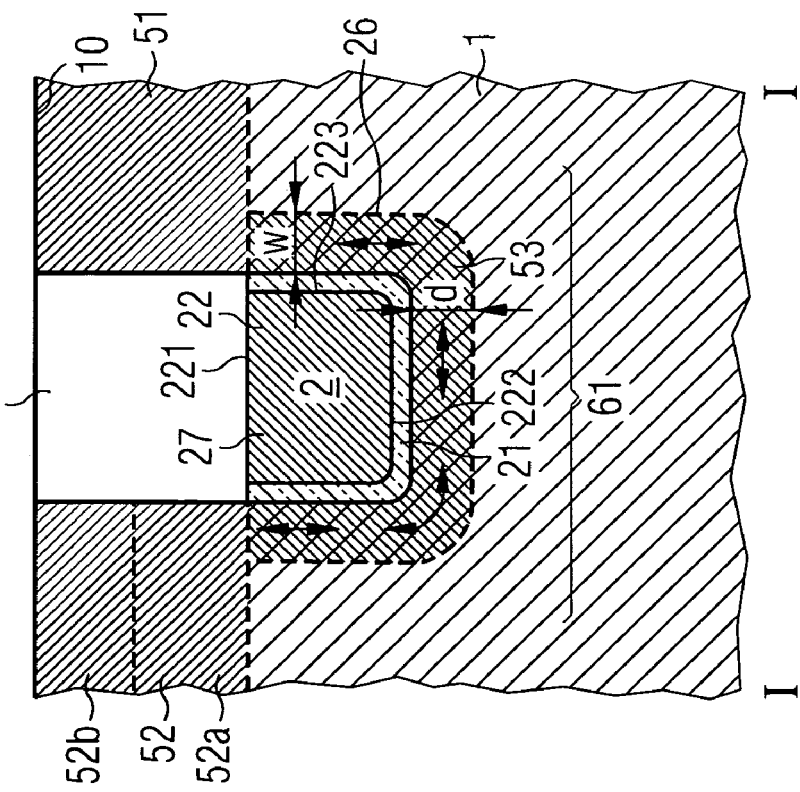

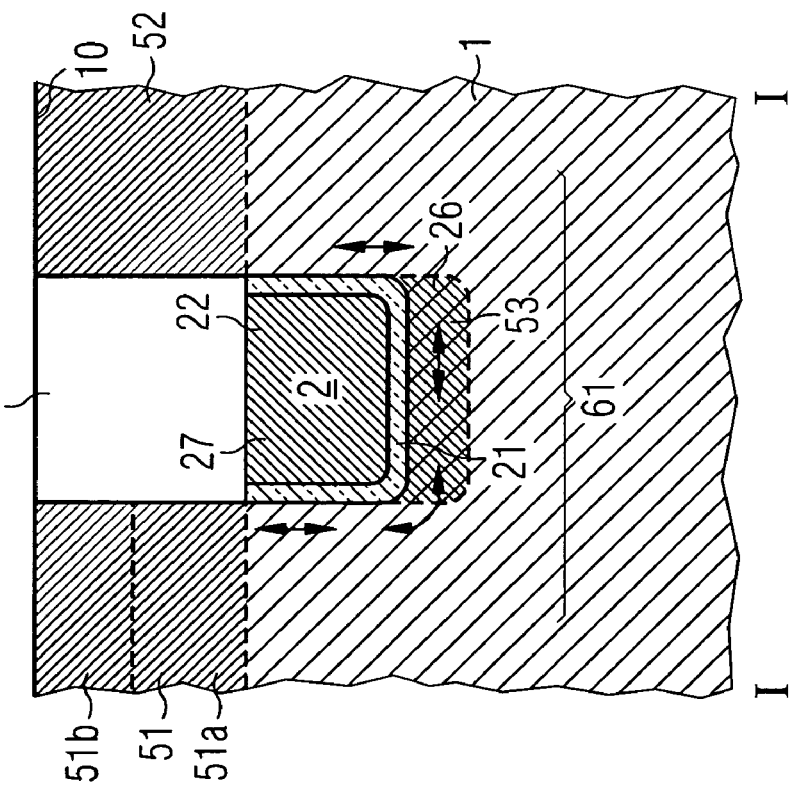
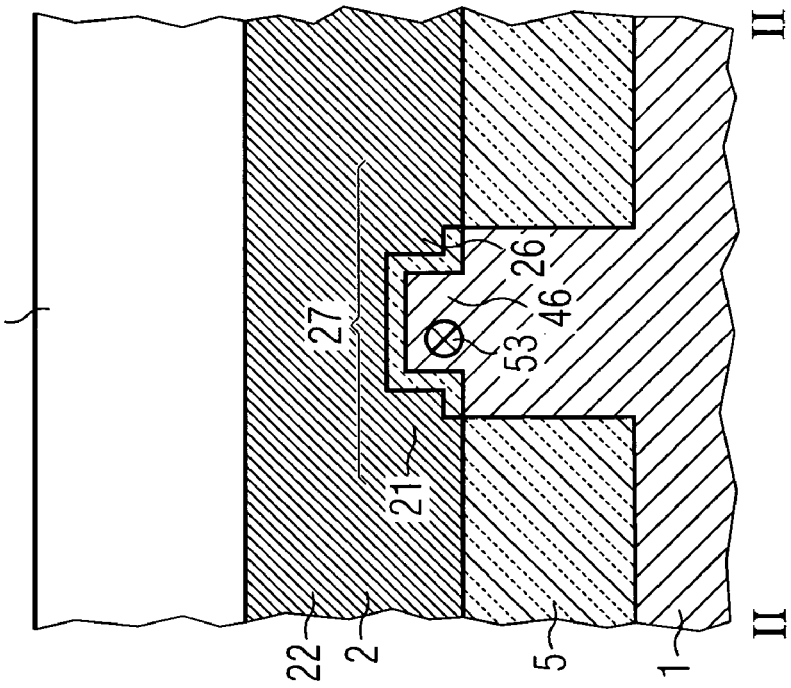

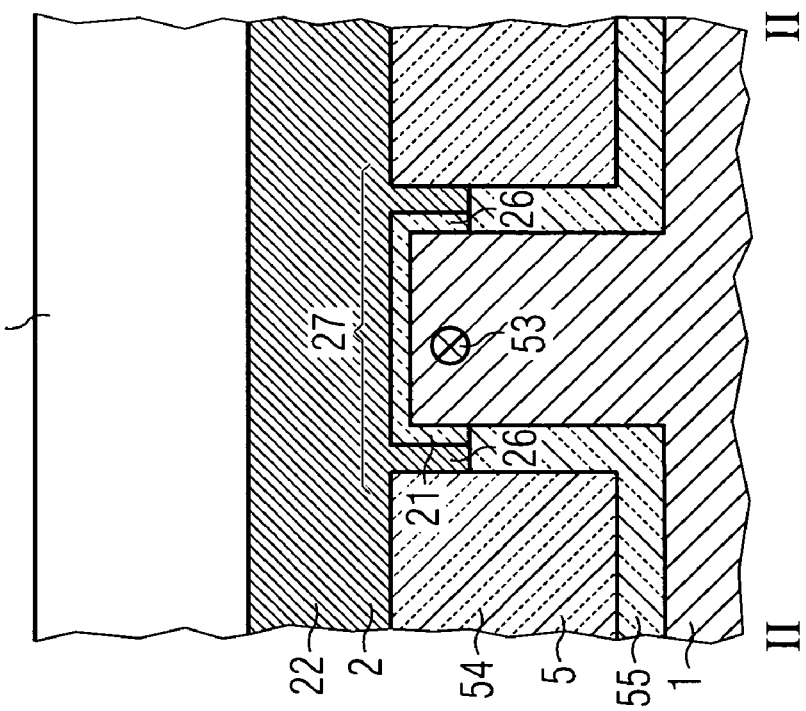
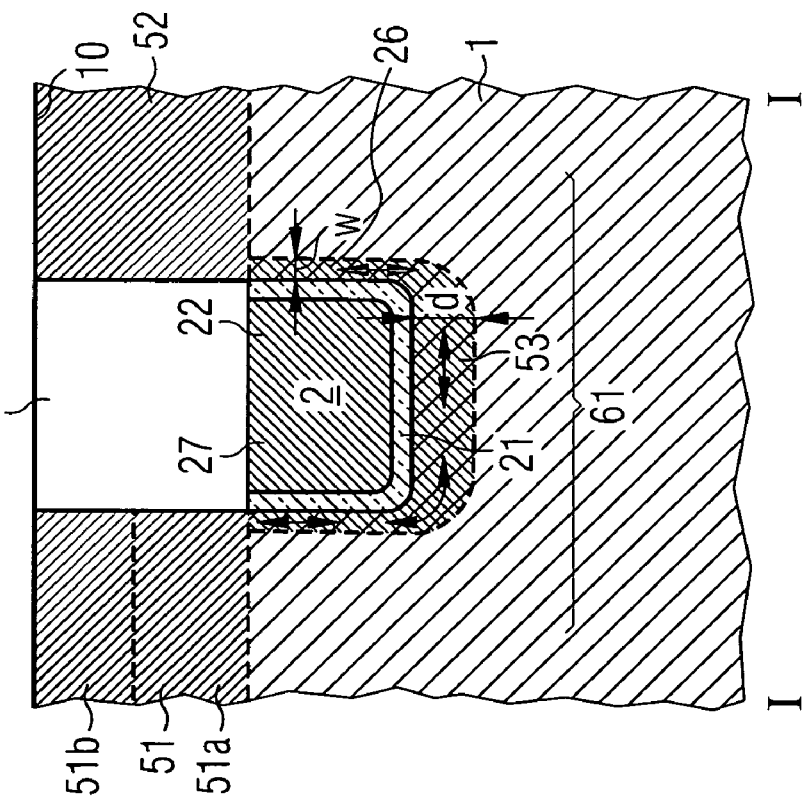

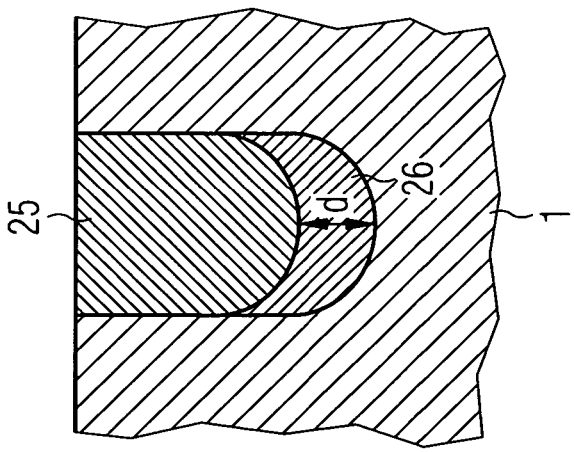
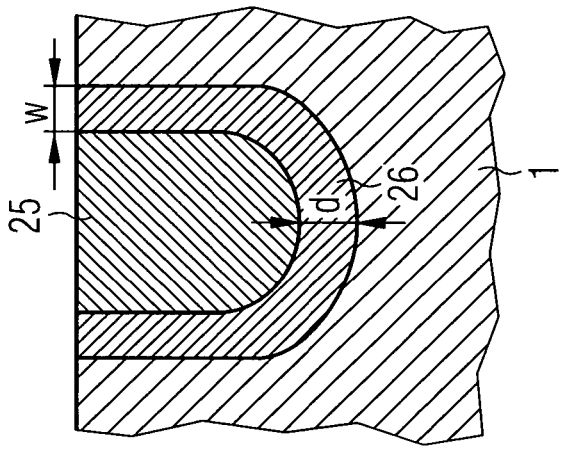
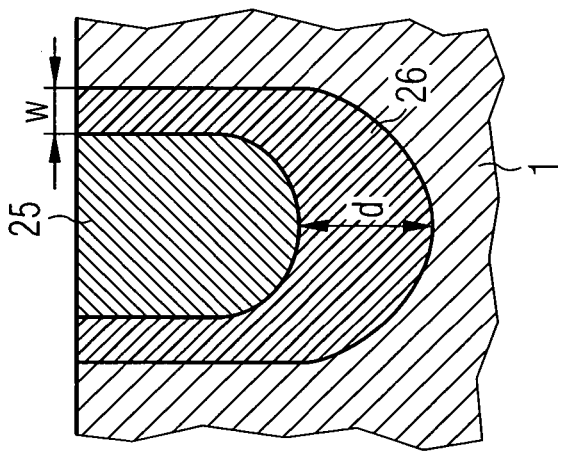

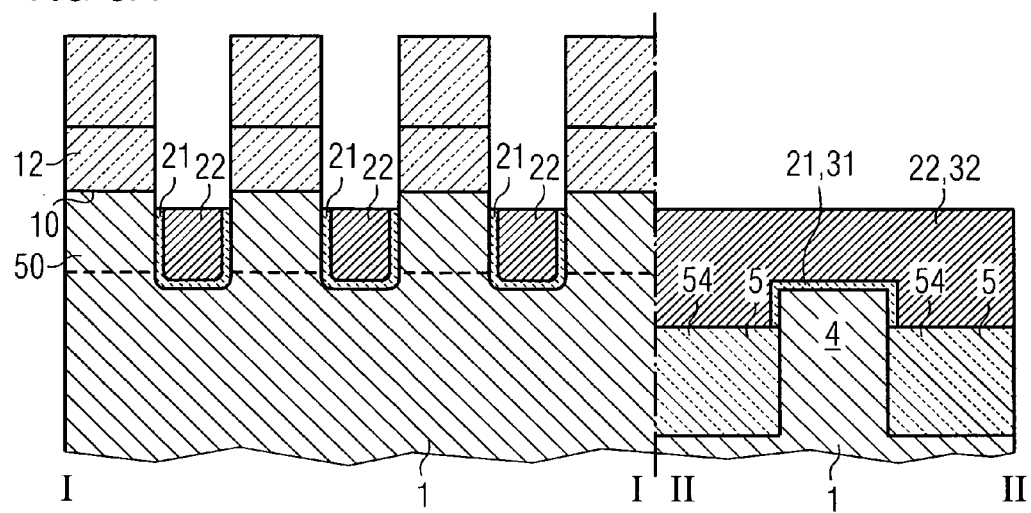
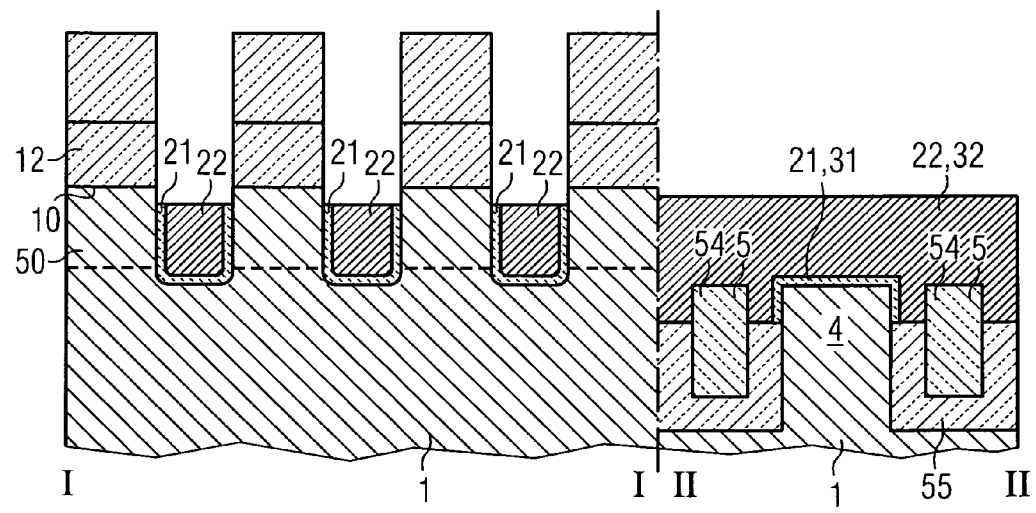

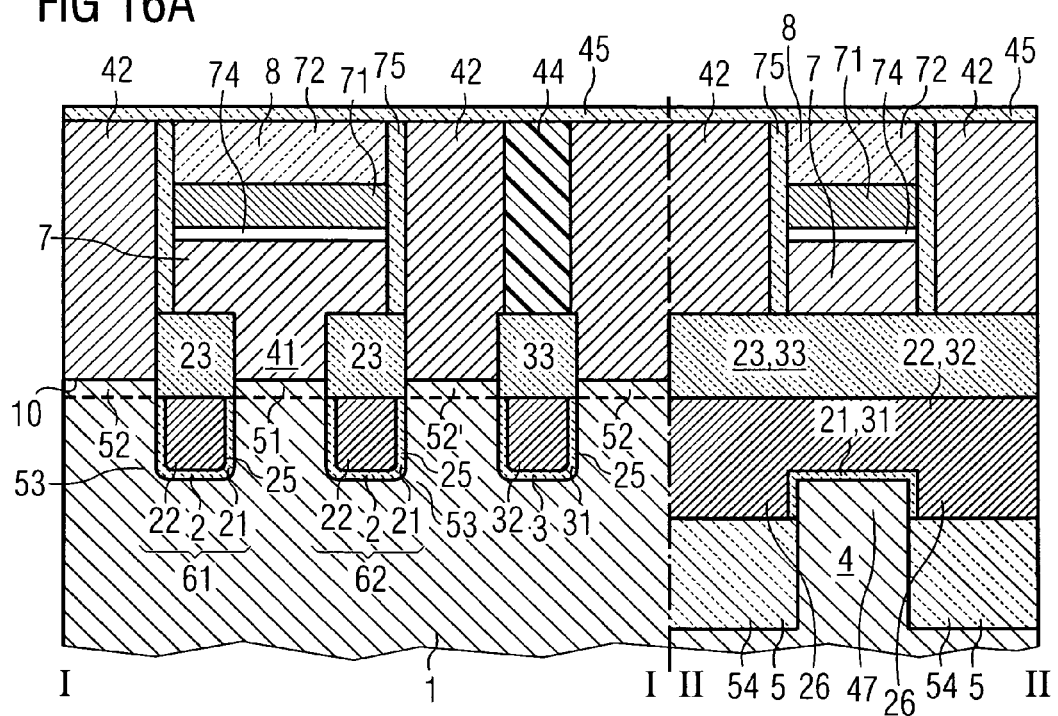

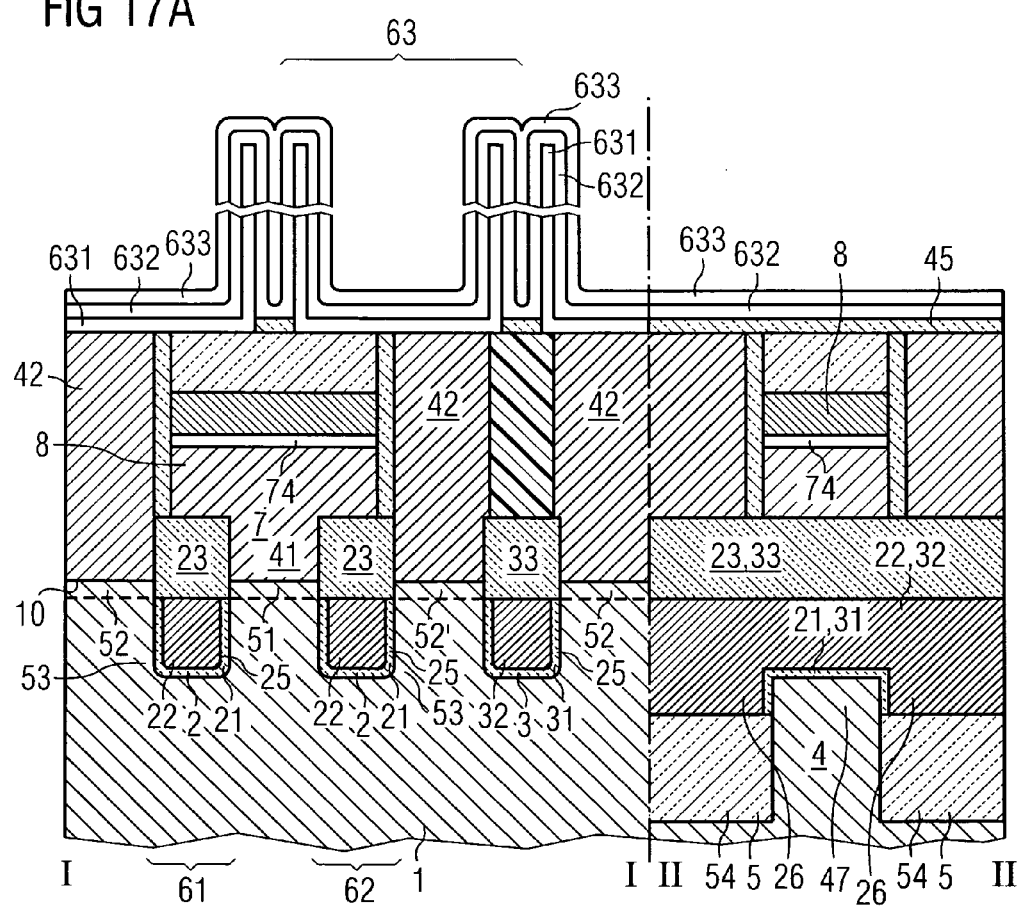

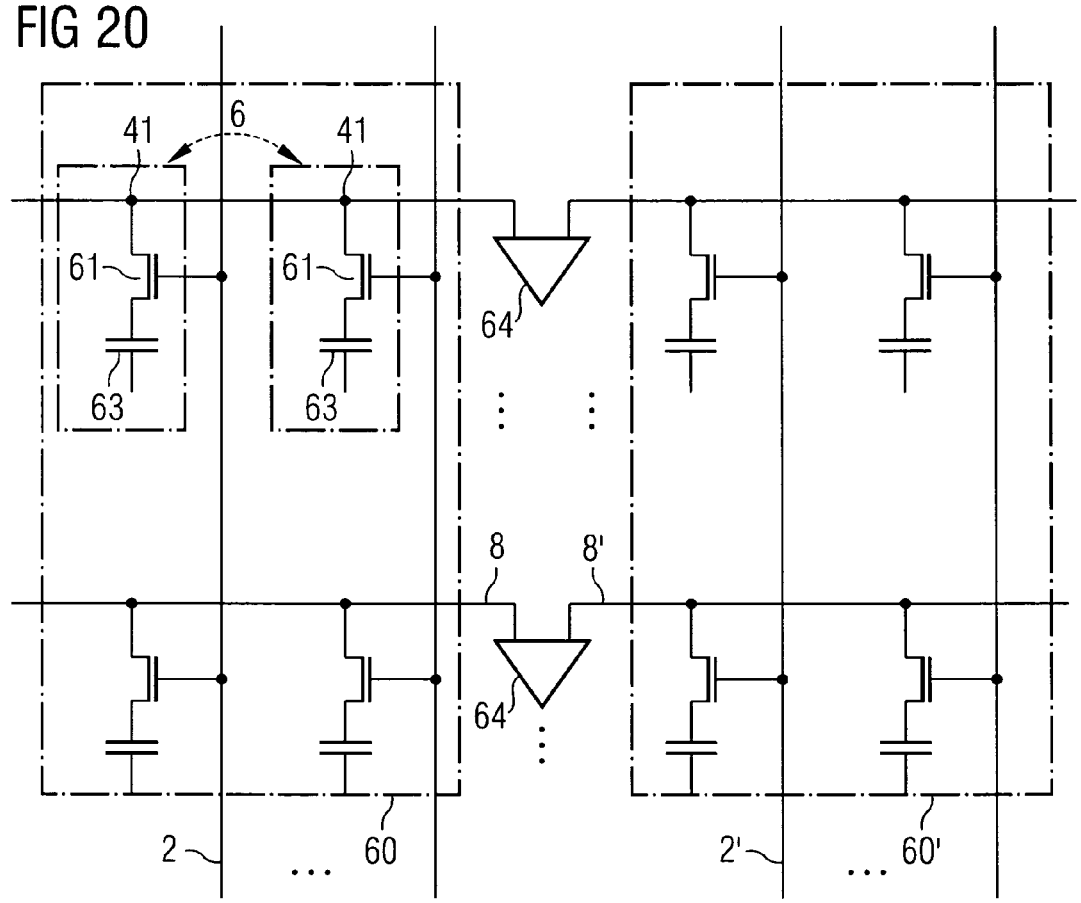

TRANSISTOR AND MEMORY CELL ARRAY

FIELD OF THE INVENTION

The invention relates to a transistor and a memory cell array comprising such a transistor as well as to a method of manufacturing such a memory cell array.

BACKGROUND

Memory cells typically comprise a storage element for storing an electrical charge which represents information to be stored, and an access transistor which is connected to the storage element. In particular, in a Dynamic Random Access Memory (DRAM), the storage element is implemented as a storage capacitor. The access transistor comprises first and second source/drain regions, a channel connecting the first and the second source/drain regions, and a gate electrode controlling an electrical current flow between the first and second source/drain regions. The transistor usually is at least partially formed in the semiconductor substrate. The gate electrode forms part of a wordline and is electrically isolated from the channel by a gate dielectric. By addressing the access transistor via the corresponding wordline, the information stored in the storage capacitor is read out. In particular, the information is read out to a corresponding bitline via a bitline contact.

In the currently used DRAM memory cells, the storage capacitor may be implemented as a trench capacitor in which the two capacitor electrodes are disposed in a trench which extends into the substrate in a direction perpendicular to the substrate surface. According to another implementation of the DRAM memory cell, the electrical charge is stored in a stacked capacitor which is formed above the surface of the substrate.

Generally, a DRAM memory cell array is desired that includes a higher packaging density and which may be produced by a simple, robust process having a low complexity and a high yield. At the same time, it is desirable to obtain optimum characteristics of the access transistor.

Accordingly, an improved transistor as well as an improved method of manufacturing such a transistor are needed. In addition, an improved memory cell array as well as an improved method of forming such a memory cell array are desired.

SUMMARY

As described herein, a transistor formed in a semiconductor substrate having a top surface comprises first and second source/drain regions, a channel connecting the first and second source/drain regions, and a gate electrode for controlling an electrical current flowing in the channel, wherein the gate electrode is disposed in a gate groove, the gate groove being defined in the top surface of the semiconductor substrate and comprising an upper and a lower groove portion, wherein the gate electrode is disposed in the lower groove portion, the upper groove portion being filled with an insulating material, and wherein the channel region comprises a fin-like portion in which the channel has the shape of a ridge, the ridge comprising a top side and two lateral sides in a cross-section intersecting a first direction, the first direction being defined by a line connecting the first and second source/drain regions, wherein the gate electrode encloses the channel at the top side and the two lateral sides thereof.

Moreover, a memory cell array comprises memory cells, each of the memory cells comprising a storage element and an access transistor, bitlines running along a bitline direction, wordlines running along a second direction, the second direction intersecting the first direction, a semiconductor substrate, the access transistors being formed in the semiconductor substrate, the access transistors electrically coupling corresponding storage elements to corresponding bitlines, the access transistors being addressed by the wordlines, the access transistors comprising doped portions being arranged adjacent to the substrate surface, a channel region connecting the doped portions, wherein a top surface of each of the wordlines is disposed beneath the top surface of the semiconductor substrate and wherein the channel region comprises a fin-like portion in which the channel region has the shape of a ridge, the ridge comprising a top side and two lateral sides in a cross-section along a corresponding one of the wordlines, wherein a part of the wordline encloses the channel region at the top side and the two lateral sides thereof.

Furthermore, a method of forming a transistor comprises: providing a semiconductor substrate having a surface; providing a gate groove extending in the substrate surface; providing first and second source/drain regions, the first and the second source/drain regions being adjacent to the substrate surface; providing a gate conductive material so that a top surface of the gate conductive material is disposed beneath the top surface of the semiconductor substrate thereby defining a gate electrode; and filling the upper groove portion with an insulating material, wherein providing the gate groove comprises defining plate like portions so that finally a channel portion connecting the first and the second source/drain regions is enclosed at three sides thereof by the gate electrode.

Moreover, a method of forming a memory cell array comprises: providing a semiconductor substrate having a top surface; providing a plurality of isolation trenches in the semiconductor substrate, thereby defining a plurality of active areas, each of the active areas being delimited by isolation trenches; providing an insulating material in each of the isolation trenches; providing transistors in the active areas, by providing first and second source/drain regions, forming a channel which is disposed between the first and second source/drain regions, and providing a gate electrode for controlling an electrical current flow between the first and second source/drain regions; providing storage elements; providing wordlines extending in a first direction, the wordlines being connected with the gate electrodes; and providing bitlines extending in a second direction, the first direction intersecting the second direction, wherein providing one of the gate electrodes comprises forming a gate groove in one of the active areas, the gate groove comprising a lower and an upper groove portions, defining pockets in the isolation trenches at a position adjacent to the gate groove, filling the pockets and the lower groove portions with a conductive material thereby forming the gate electrode comprising plate-like portions, and filling the upper groove portions with an insulating material.

In addition, a transistor, being formed in a semiconductor substrate having a top surface, comprises: first and second doped regions, the first and second doped regions being adjacent to the top surface; a channel connecting the first and second doped regions; means for controlling an electrical current flowing in the channel, wherein the means for controlling the electrical current is disposed in a groove, the groove being defined in the top surface of the semiconductor substrate; and means for laterally confining the channel in a cross-section intersecting a line connecting the first and second doped regions, part of the means for controlling an electrical current being disposed in the means for laterally confining the channel, wherein a top surface of the means for controlling the electrical current is disposed beneath the top surface of the semiconductor substrate.

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

BRIEF DESCRIPTION OF THE DRAWINGS

FIGS. 1A to 1F illustrate various cross-sectional views of embodiments of the present invention.

FIGS. 2 to 17 illustrate one embodiment of a method of manufacturing a transistor according to the present invention.

FIG. 20 shows a schematic circuit representing a memory cell array comprising a transistor according to an exemplary embodiment of the present invention.

DETAILED DESCRIPTION

In the following detailed description reference is made to the accompanying drawings, which form a part hereof and in which is illustrated by way of illustration specific embodiments in which the invention may be practiced. In this regard, directional terminology such as "top", "bottom", "front", "back", "leading", "trailing", etc., is used with reference to the orientation of the Figures being described. Since components of embodiments of the present invention can be positioned in a number of different orientations, the directional terminology is used for purposes of illustration and in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

In the following description, various views of transistors will be shown. As is clearly to be understood, the cross-sectional views of FIGS. 1A, 1C and 1E can be arbitrarily combined with any of the cross-sectional views shown in FIGS. 1B, 1D and 1F, and vice versa.

Figure 1G:
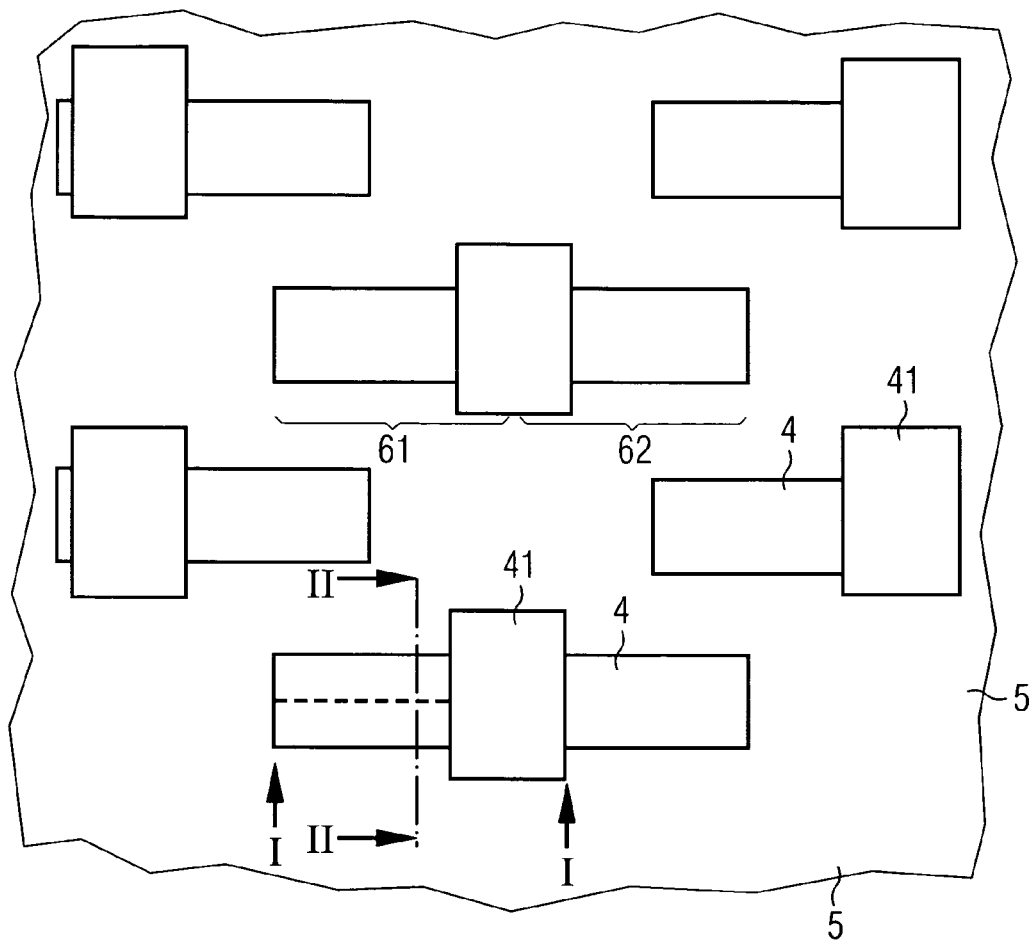
FIG. 1G shows an exemplary plan view of an array of transistors.

FIG. 1A shows a cross-section of a transistor according to an exemplary embodiment of the present invention. The cross-sectional view of FIG. 1A is taken between I and I as can be gathered from the exemplary layout shown in FIG. 1G, for example. The cross-sectional view of FIG. 1A is taken perpendicularly with respect to the wordlines and along a direction parallel to a line connecting the first and the second source/drain regions 51, 52.

The access transistor 61 illustrated in FIG. 1A comprises first and second source/drain regions 51, 52. For example, the second source/drain region 52 may comprise a heavily doped portion 52b and a lightly doped portion 52a. Likewise, the first source/drain region 51 may comprise a lightly doped portion and a heavily doped portion. Nevertheless, it is also possible, that the two source/drain regions are asymmetric with respect to each other, for example, the first source/drain region 51 being entirely implemented as a heavily doped portion. As will be shown later, the first source/drain region 51 is to be connected with a corresponding bitline, whereas the second source/drain region 52 is to be connected with the storage electrode of a storage capacitor. The first and the second source/drain regions 51, 52 are disposed adjacent to the surface 10 of a semiconductor substrate 1, for example, a lightly p-doped silicon substrate. The first and the second source/drain regions may be implemented as n-doped portions. The gate electrode 27 is formed in a gate groove 25 which is formed in the semiconductor substrate surface 10. In particular, the gate electrode 27 is electrically insulated from the substrate 1 by a gate insulating layer 21. The gate electrode 27 controls an electric current flow between the first and the second source/drain regions 51, 52. The channel 53 is formed between the first and the second source/drain regions. The gate groove 25 is filled with an conductive material 22. In particular, the surface of the conductive material 22 of the gate electrode 27 is disposed beneath the substrate surface 10. Accordingly, an insulating layer 23 is disposed above the gate electrode 27 so as to fill the gate groove 25. In a memory cell, usually, the gate electrodes 27 form part of a corresponding wordline 2 which extends perpendicularly with respect to the depicted plan of the drawing. Accordingly, in the memory cell array comprising the transistor shown in FIG. 1A, the wordline 2 is completely buried, i.e., the surface 221 of the wordline 2 is disposed beneath the substrate surface 10, with an insulating material being disposed above the wordline. In particular, the surface of the insulating layer 23 is at the same height as the substrate surface 10. For example, the wordline 2 may be made of a conductive material such as metal, in particular titanium nitride, tungsten, or other metals as commonly used in the art.

In a plane which is positioned before and behind the illustrated plane of the drawings, plate-like portions of the gate electrode 27 are disposed. In particular, the plate-like portions 26 may extend to a predetermined depth d and they may laterally extend to a predetermined width w. In particular, the width w is measured from the bottom portion of the conductive layer of the gate electrode, and the width is measured from the lateral side of the conductive layer 22 forming part of the gate electrode 27. In the embodiment shown in FIG. 1A, the width w corresponds to the depth d, i.e., the channel is enclosed by the plate-like portions to the same extent, irrespective of the orientation of the channel.

FIG. 1B shows a cross-sectional view of the transistor according to an embodiment of the present invention, the cross-sectional view being taken between II and II, as can be seen from FIG. 1G, for example. The cross-section shown in FIG. 1B intersects the cross-section shown in FIG. 1A. In case a layout such as the one shown in FIG. 1G is used, the cross-sectional view of FIG. 1B is taken perpendicularly with respect to the cross-sectional view of FIG. 1A. Accordingly, the cross-sectional view of FIG. 1B is parallel to the direction of a wordline 2. In FIG. 1B, an active area 4 (FIG. 1G) is laterally delimited by isolation trenches 5. The isolation trenches 5 may be filled with one or more insulating materials. For example, the isolation trench 5 may be filled with silicon oxide. As is shown, the channel 53 extends perpendicularly to the plane of the drawing. The channel 53 of the transistor is enclosed at three sides thereof by the gate electrode 27.

Figure 1H:
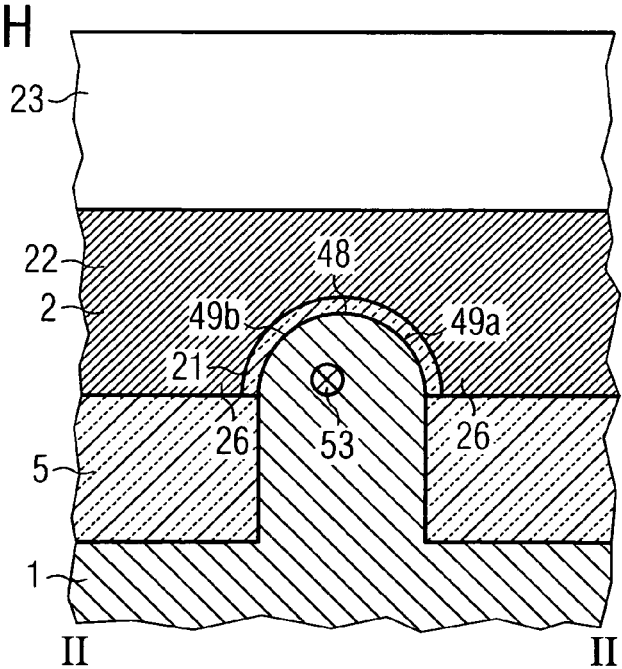
FIG. 1H is a cross-sectional side view of a transistor having a curve-shaped ridge.

The channel has the shape of a ridge, the ridge comprising a top side 48 and two lateral sides 49a, 49b. As is clearly to be understood it is not necessary that the top side 48 and the two lateral sides 49a, 49b be implemented as straight planes intersecting at a defined angle. The top side 48 and the two lateral sides 49a, 49b can as well be implemented as curved surfaces, as is shown in FIG. 1H. In this case, the term "top side" refers to the upper portion of the ridge, whereas the term "lateral side" refers to the lateral portion of the ridge.

As has been mentioned above, the gate electrode 27 is insulated from the channel by the gate dielectric 21. Moreover, as can be taken from FIG. 1B, the gate electrode 27 forms part of a wordline 2. An insulating layer 23 is disposed above the wordline 2. As can further be seen from FIG. 1B, the plate-like portions 26 are disposed laterally adjacent to the channel 53.

FIG. 1C shows a further cross-sectional view of a transistor 61. The transistor shown in FIG. 1C is quite similar to the transistor shown in FIG. 1A. Nevertheless, as can be gathered, the plate-like portions are defined so that they extend downwards; however, they do not laterally extend. Accordingly, the depth d can have a value which is similar to the value of d in FIG. 1A, whereas the width w is almost or substantially zero.

FIG. 1D shows a further exemplary cross-sectional view of the transistor between II and II. As can be seen, the active area 4 has been thinned in a channel portion 53. For example, the active area 4 which has the shape of a fin can be thinned by performing a further etching step of etching silicon substrate material after defining the plate-like portions, as will be explained later. In the case of a thinned fin, the characteristics of the transistor can be further improved. For example, the transistor may become fully depleted, so that a steeper slope is obtained.

FIG. 1E shows a further cross-sectional view of the transistor 61 between I and I. As can be seen, the width w is smaller than the depth d. This specific shape of the plate-like portions can be implemented by selecting specific etching conditions when defining the plate-like portions. The remaining portions of the transistor are similar to the transistors shown in FIGS. 1A and 1C, respectively.

FIG. 1F shows a cross-sectional view of the substrate between II and II according to a further embodiment of the present invention. In the embodiment shown in FIG. 1F, the isolation trenches 5 are, first, filled with a conformal liner layer 55, followed by a silicon oxide layer 54. For example, the material of the liner layer 55 may be chosen so as to be able to be etched selectively to the silicon oxide layer 54. Accordingly, the plate-like portions 26 of the gate electrode 27 may be defined by an etching step which etches the liner layer 55 selectively with respect to the silicon oxide layer 54. Hence, the plate-like portions 26 are only defined at a position which is directly adjacent to the channel region 53. The remaining upper portion of the isolation trenches 5 is filled with an insulating material. As a result, the plate-like portions 26 and, thus, the wordlines 2 scarcely extend in a plane which is before and behind the illustrated plane of the drawing. As a consequence, the coupling capacitance and cross-talking between adjacent wordlines are reduced. As is clearly to be understood, the special arrangement of the plate-like portions shown in FIG. 1F can also be obtained by a different manufacturing process.

As will be evident from FIGS. 1A-1F, the word line extends through the transistor structure, such that the portion of the word line that is adjacent to the source/drain region (i.e., the portion that crosses beneath and between the source/drain regions) serves as the gate electrode for the transistor. This gate electrode portion of the word line, however, has a narrower transverse cross section (i.e., the cross section in the plane orthogonal to the direction of the word line) than portions of the word line immediately adjacent to the gate electrode portion in both directions. Specifically, the gate electrode portion of the word line is narrower in width or shallower in depth (or both) than the immediately adjacent portions of the word line, such that the portion of the substrate that extends into the region adjacent the gate electrode portion of the word line is surrounded on either side by the wider/deeper portions of the word line. This surrounded portion of the substrate has a generally semi-annular shape (e.g., somewhat like a semi-toroid, though not necessarily round) and serves as the channel region. As used herein, the term semi-annular refers to any partial ring-like shape and is not limited to round shapes (e.g., the term may encompass square-like ring shapes) and is not limited to exactly one-half of a ring-shaped structure but any portion of a ring-shaped structure. Likewise, as used herein, the terms semi-toroid or semi-toroidal are not limited to shapes that are strictly round or have a round cross-section, and include, for example, square-like partial doughnut shapes.

The smaller cross-sectioned gate electrode portion and the immediately adjacent larger cross-sectioned portions of the word line collectively serve as the gate electrode for the transistor and essentially surround the semi-annular channel region on three sides. Specifically, the gate electrode portion of the word line extends along the top or upper surface of the channel region, and the two adjacent portions of the word line respectively extend along the two lateral sides of the channel region.

FIG. 1G shows an exemplary layout of a memory cell array comprising transistors as have been described before. As can be seen, a plurality of active areas 4 are formed in a semiconductor substrate. To be more specific, the active areas 4 are defined by forming isolation trenches 5 which are filled with an insulating material. As can be seen, there are a plurality of segments of active area lines, two transistors 61, 62 being arranged in one active area segment. Two adjacent access transistors 61, 62 share one common bitline contact. In the arrangement shown in FIG. 1G, the segments of the active areas are arranged in a checkerboard pattern so that the segments of active areas of adjacent rows are disposed in a staggered manner. Nevertheless, as is obvious to the person skilled in the art, the transistors of the present invention as well as the memory cell array may be implemented in any suitable layout. For example, the layout which will be illustrated hereinafter with reference to FIG. 18 or 19, for example, may be implemented as well.

The present invention may advantageously be applied to DRAM memory cells comprising a storage capacitor which may be disposed above or below the substrate surface. Nevertheless, the invention is not limited to a DRAM memory cell. In particular, the memory cell array may comprise arbitrary kinds of storage elements. For example, the storage elements may be a switchable resistor so as to implement a CBRAM ("conducting bridge random access memory"), PCRAM ("phase-changing random access memory") or others. Likewise the memory cell array may comprise FeRAM ("ferroelectric random access memory") or MRAM ("magnetoresistive random access memory") memory cells.

FIGS. 2 to 17 illustrate a method of forming a memory cell array comprising any of the transistors shown in FIGS. 1A to 1F, respectively.

Figure 9A:
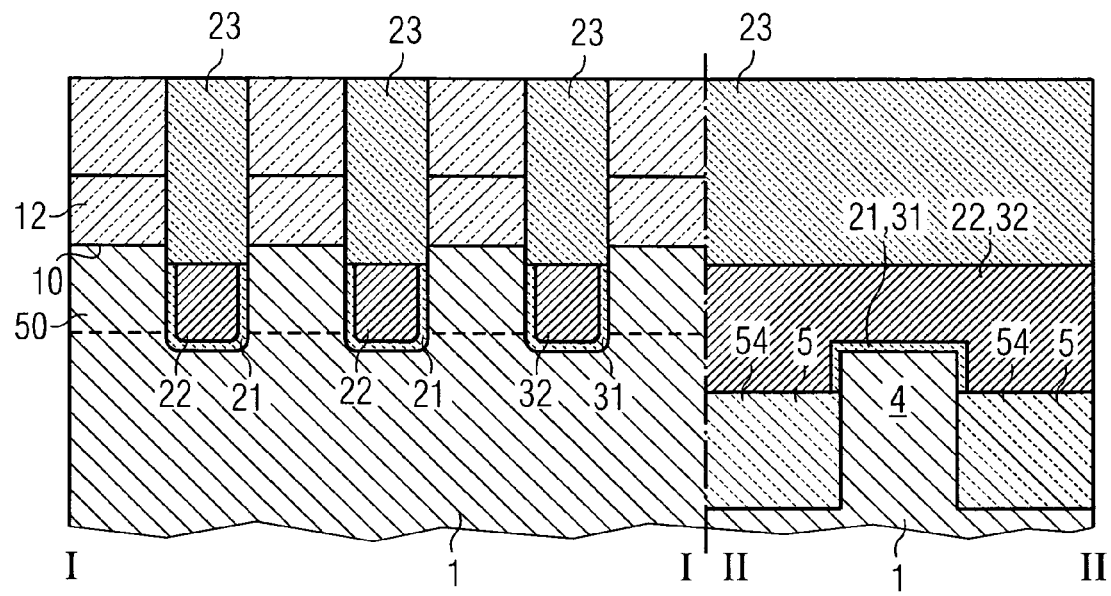
Figure 9B:
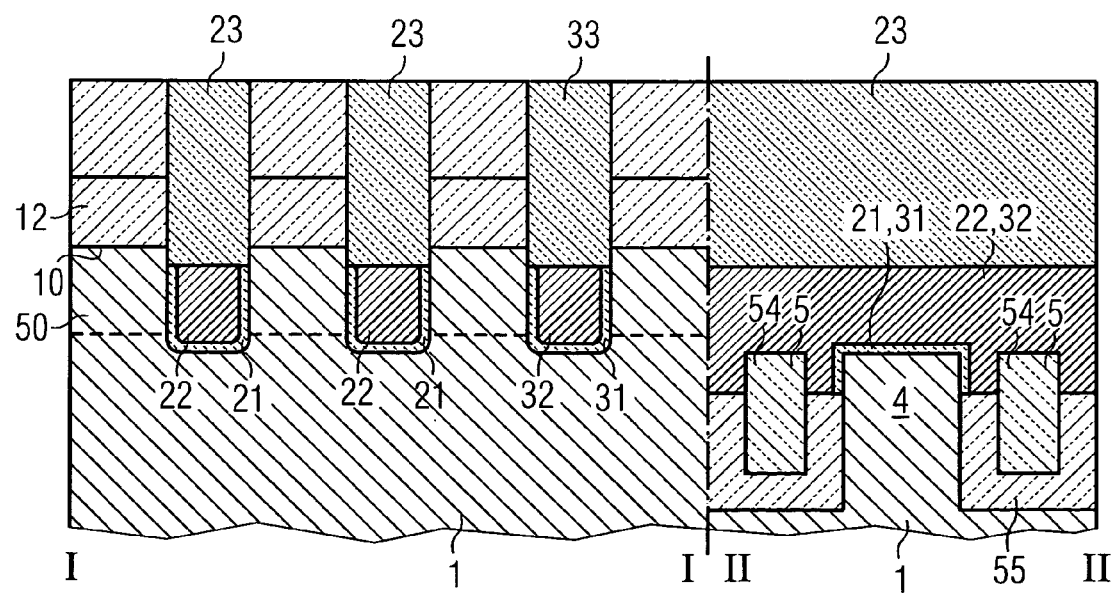
Figure 9C:
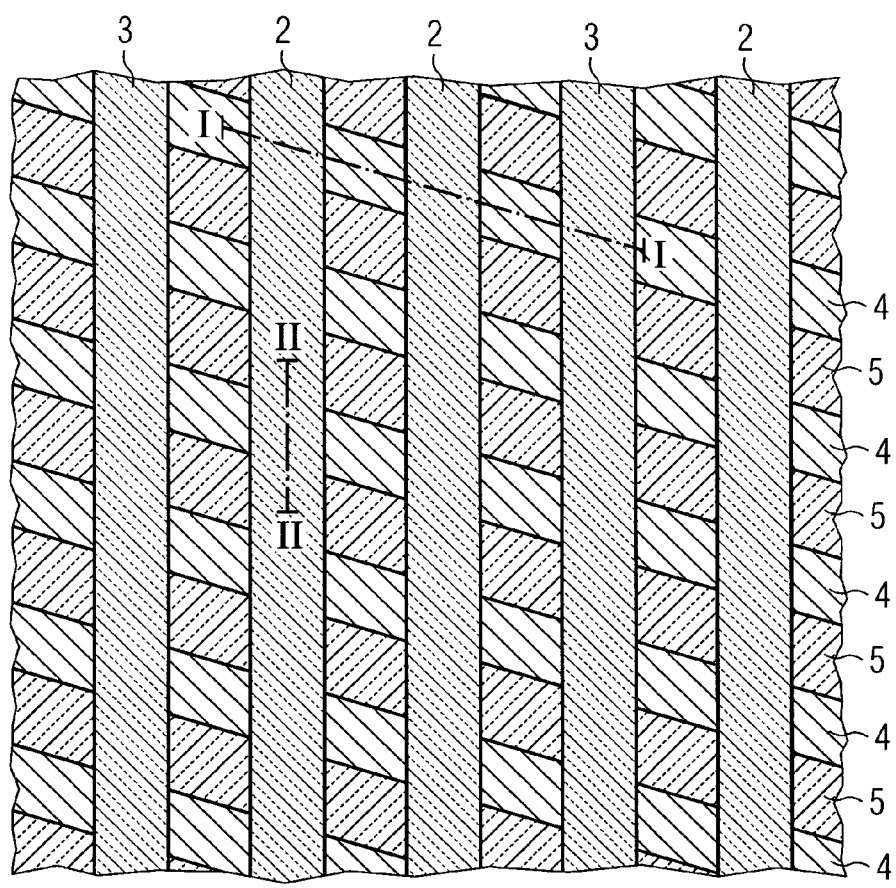

The following cross-sections are taken between I and I, and II and II, respectively, as can be seen, for example from FIG. 9C. To be more specific, the cross-section between I and I is taken along a longer side of active area 4 so as to intersect two wordlines 2 and one so-called isolation gate line 3, the function thereof will be explained later. Moreover, the cross-section between II and II is taken along a wordline so as to intersect a first isolation trench 5, an active area line 4 and a second isolation trench 5.

Figure 2A:
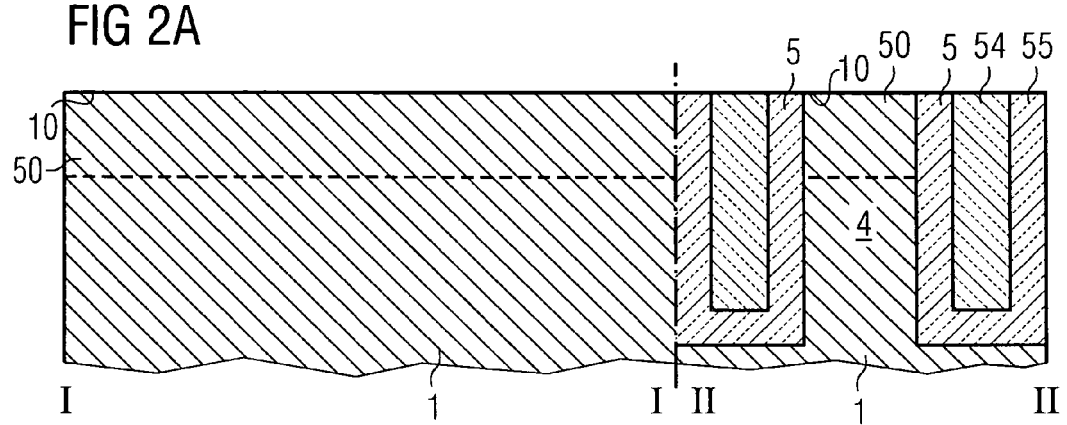

Starting point for implementing the method of the present invention is the structure shown in FIG. 2A. In FIG. 2A the left hand side shows the cross-section along a longer side of an active area between I and I, whereas the right hand side of FIG. 2A shows a cross-section perpendicular to the bitlines 8 at a position of a wordline to be formed, between II and II, in the plan view of the memory cell array shown in FIG. 2B.

For obtaining the structure shown in FIG. 2A, on the surface 10 of a semiconductor substrate 1, such as a silicon substrate, in particular, a p-doped silicon substrate, first, a pad oxide layer made of silicon dioxide (not shown) may be deposited. Thereafter, optionally, first, the well portions, then the usual LDD (Lightly Doped Drain) portions which are advantageously disposed beneath the source/drain portions and, optionally, a doped region 50 for defining the first and second source/drain regions may be formed by ion implantation. Thereafter, a pad silicon nitride layer (not shown) is deposited by generally known methods. The pad silicon nitride layer 11 as well as the previously deposited pad oxide layer act as a hardmask layer stack. As is to be noted, the hardmask layer stack may comprise one or more layers. Accordingly, the term "hardmask layer stack" as used herein comprises one or more layers. In particular the hardmask layer stack comprises at least one layer which is different from the layer to be patterned. In particular, if the hardmask layer stack comprises only one layer, this layer has to be different from the material to be patterned.

Then, the active area portions are photolithographically defined by patterning isolation trenches 5 as is generally known in the art. The isolation trenches 5 usually have a depth of approximately 250 nm and a distance of 1 F. Accordingly, active areas having a width of about 1 F are defined, as can be seen from the cross-section between II and II. The active areas 4 can be formed as continuous lines or as segments of lines as has been explained with reference to FIG. 1G. As will be used hereinafter, F denotes the minimum pitch according to the technology used. For example, a minimum pitch of 90 nm, 60 nm, 50 nm, 40 nm or even less is desired.

After etching the isolation trenches 5, optionally, an oxidation step is performed so as to oxidize the sidewalls of the active areas. Thereafter, a liner layer 55 is deposited on the sidewalls of the isolation trenches. In particular, the liner layer is conformally deposited and is made of an insulating material. Moreover, the liner layer 55 preferably is made of a material which can be etched selectively with respect to the substrate material and the silicon oxide layer 54. Examples of the material of the liner layer 55 comprise silicon nitride, or any other suitable oxide or semiconductor compound. Thereafter, a silicon oxide layer 54 is deposited. Finally, the isolation trenches are completely filled with an isolating material. Then, a planarizing step is performed.

After defining the isolation trenches 5, the pad nitride layer is stripped, and, for example, ion implantation steps may be performed. In particular, by these ion implantation steps, the entire substrate surface is implanted with ions, thereby optionally defining the well portions. Moreover, thereby, optionally, the doped portion 50 from which the first and second source/drain portions may be formed is defined. FIG. 2A shows a cross-sectional view of the resulting structure. As can be seen, between I and I, a doped portion 50 is disposed adjacent to the substrate surface. As is clearly to be understood, the depth of the doped portion 50 as illustrated in FIG. 2A is not necessarily to scale with the other components of the drawings. Accordingly, the doped portion 50 may as well extend to a different depth. Moreover, between II and II, isolation trenches 5 are disposed. Between two isolation trenches 5, an active area 4 is defined. The isolation trenches are filled with a silicon nitride liner layer 55 and a silicon oxide layer 54.

Figure 2B:
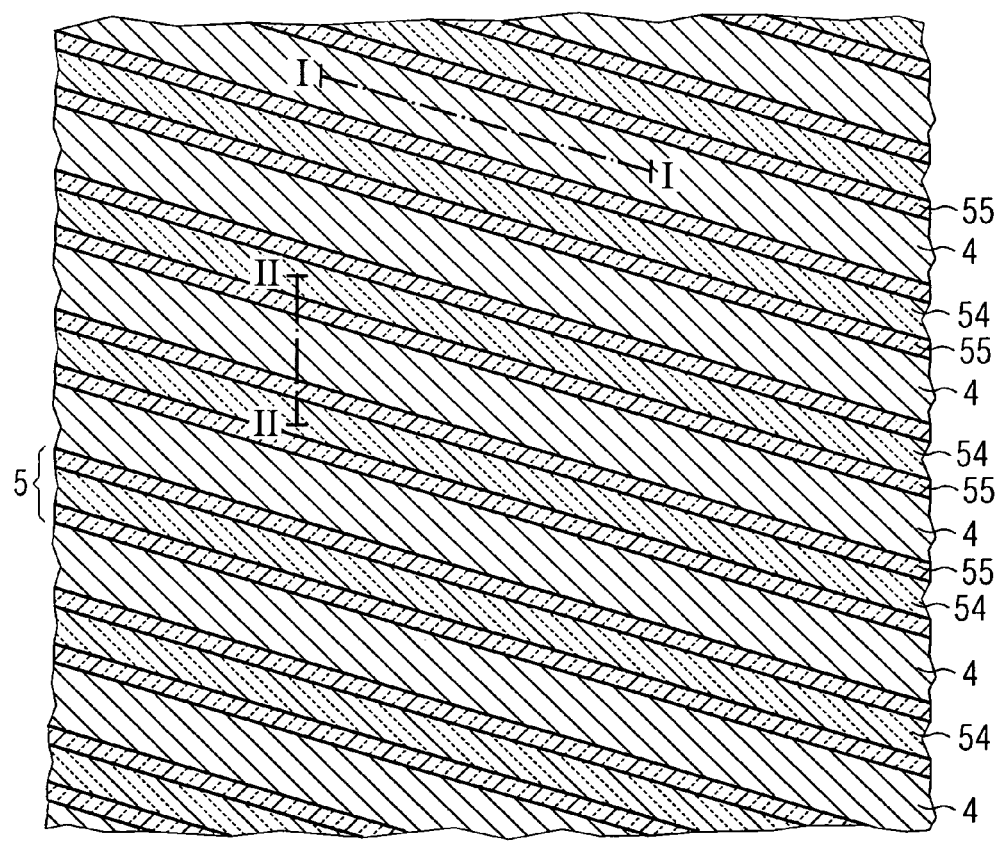

FIG. 2B shows a plan view of the resulting structure. As is depicted in FIG. 2B, the active areas 4 may be formed as continuous active area lines. Adjacent to the active area lines 4, the silicon nitride liner layer 55 is provided. Adjacent active areas 4 are isolated by the isolation trenches 5.

Figure 3:
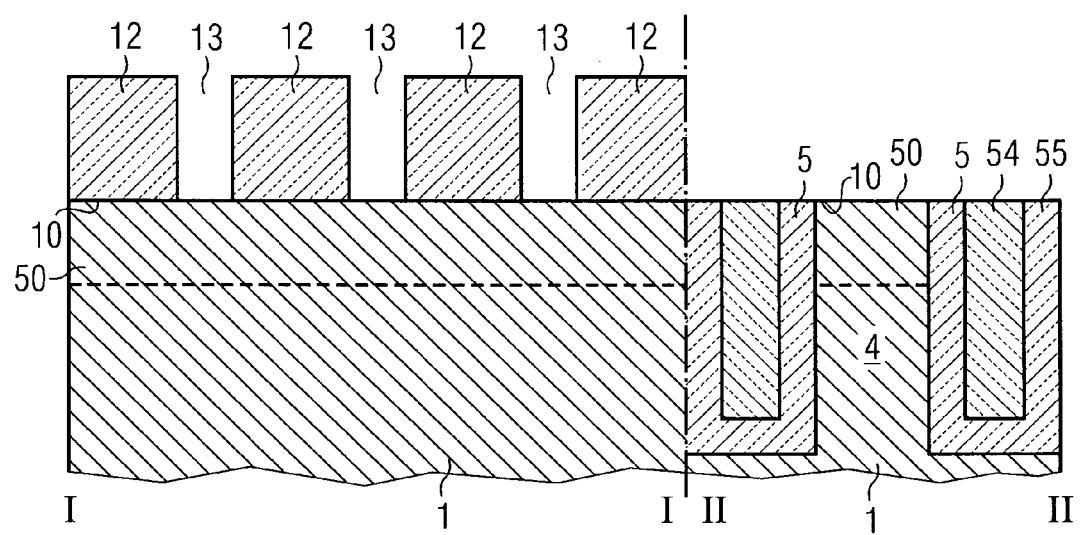

In the next steps, the gate grooves 25 for forming the wordlines and the isolation gate lines are photolithographically defined. To this end, first, a hardmask layer 12 made of polysilicon or carbon, for example, or comprising more than one layer, is deposited at a thickness of about 700 nm. Thereafter, using a mask having a stripe pattern, openings 13 in the hardmask layer are photolithographically defined and etched. The width of the openings 13 is smaller than F. The resulting structure is shown in FIG. 3.

Figure 4A:
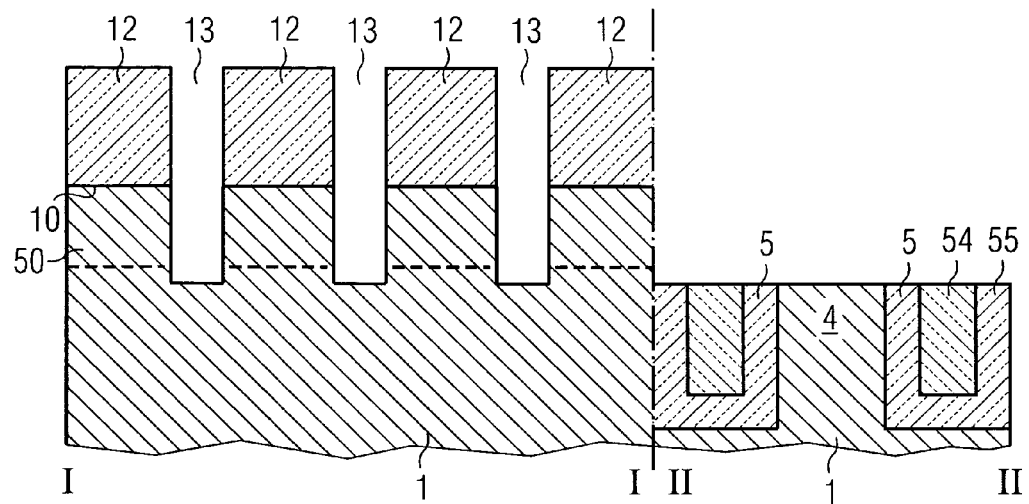
Figure 4B:
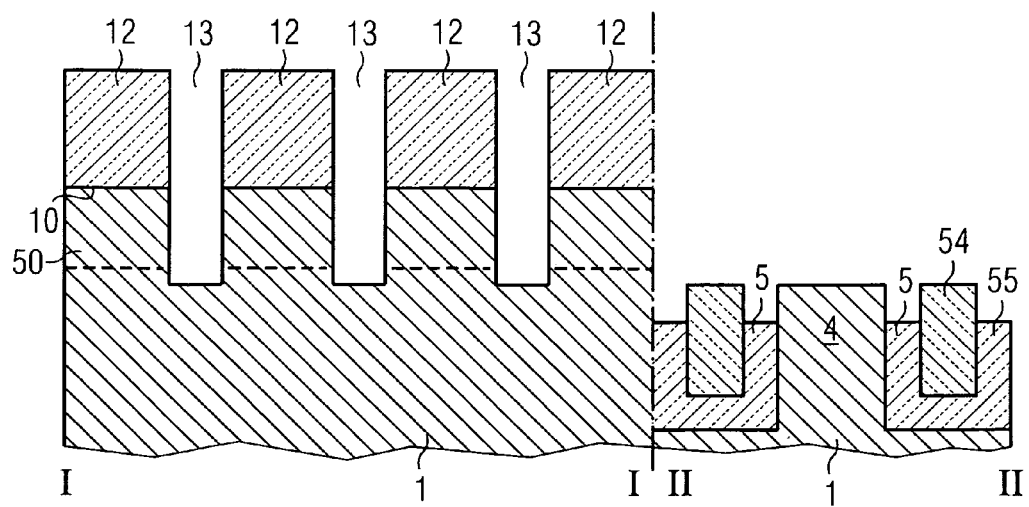
Figure 5A:
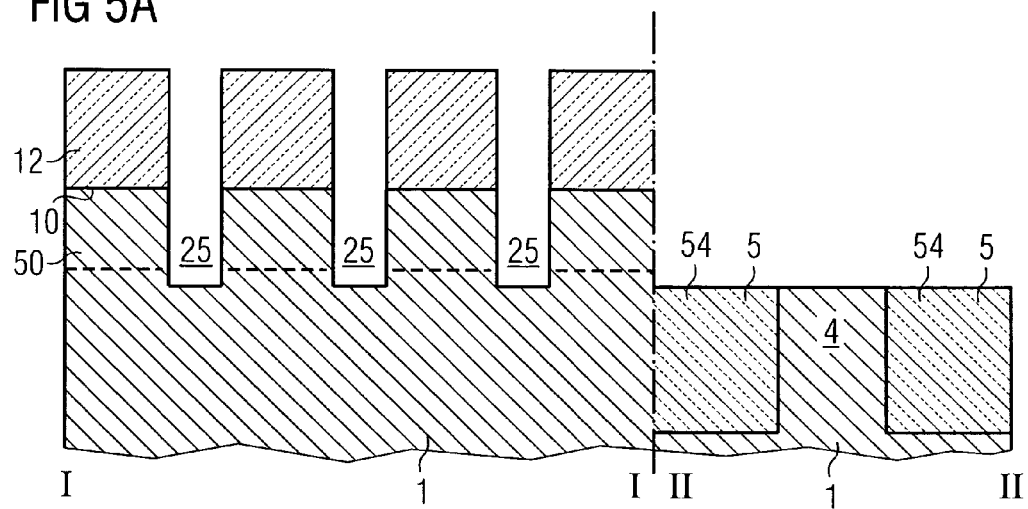

Thereafter, an etching step is performed so as to define gate grooves 25 in the semiconductor substrate 1. This etching step may be non-selective. Accordingly, in the cross-section between II and II also the material of the isolation trenches 5 may be etched. FIG. 4A shows the cross-sectional view of the resulting structure after etching the gate grooves 25 in the semiconductor substrate by a non-selective etching step. As can be seen, the material present in the isolation trenches 5 is etched at the same rate as the substrate material so that in each of the gate grooves 25 a plan surface is produced. Nevertheless, this etching step may as well be slightly selective, etching the silicon nitride layer 50 at a higher rate than the substrate material 1. As a consequence, the structure shown in FIG. 4B is obtained. As can be seen in the portions of the isolation trench 5, the silicon nitride material 55 is recessed. Accordingly pockets are formed adjacent to the active area 4. Moreover FIG. 5A shows a cross-sectional view of the structure after a non-selective etching step, in the case in which the isolation trenches 5 are filled with only one insulating material, for example, silicon oxide.

Figure 5B:
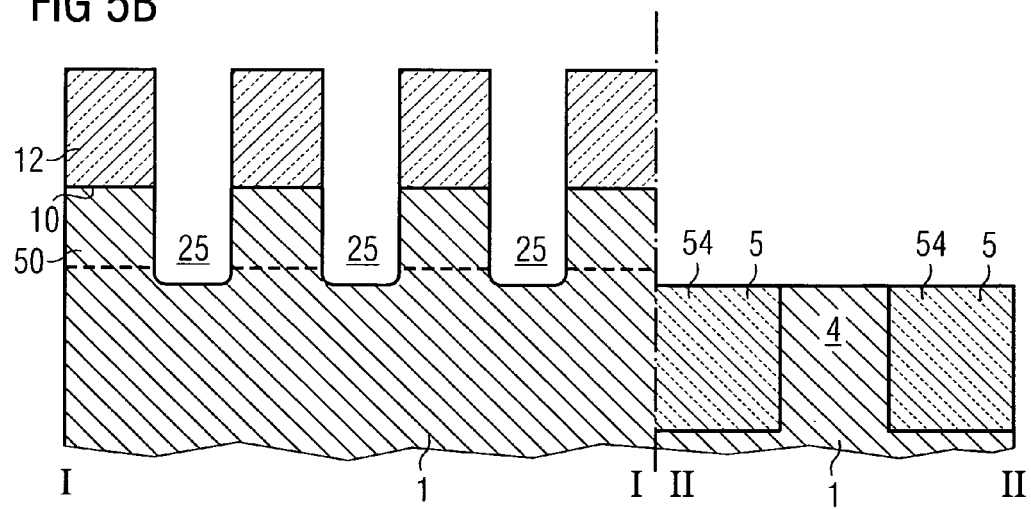

For example, the grooves 25 may have a width of 0.5 to 0.7 F. Then, an isotropic etching step, for example, a wet etching step or a dry etching step, in particular, a so-called CDE (Chemical Downstream Etching) is performed, so as to etch silicon and silicon dioxide. Thereby, the gate grooves 25 are widened. In addition, by this isotropic etching step, also the corners of the gate grooves 25 at the bottom surface thereof are rounded. FIG. 5B shows a cross-section of the resulting structure, in which the corners of the gate grooves are rounded so as to avoid a non-uniform electrical field at these portions.

Figure 6A:
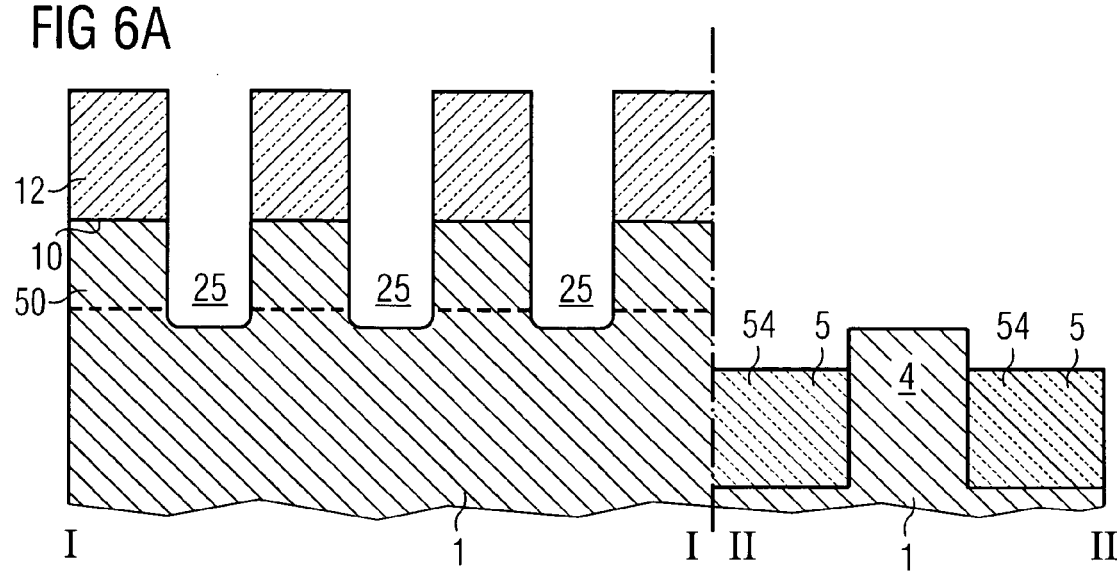
Figure 6B:
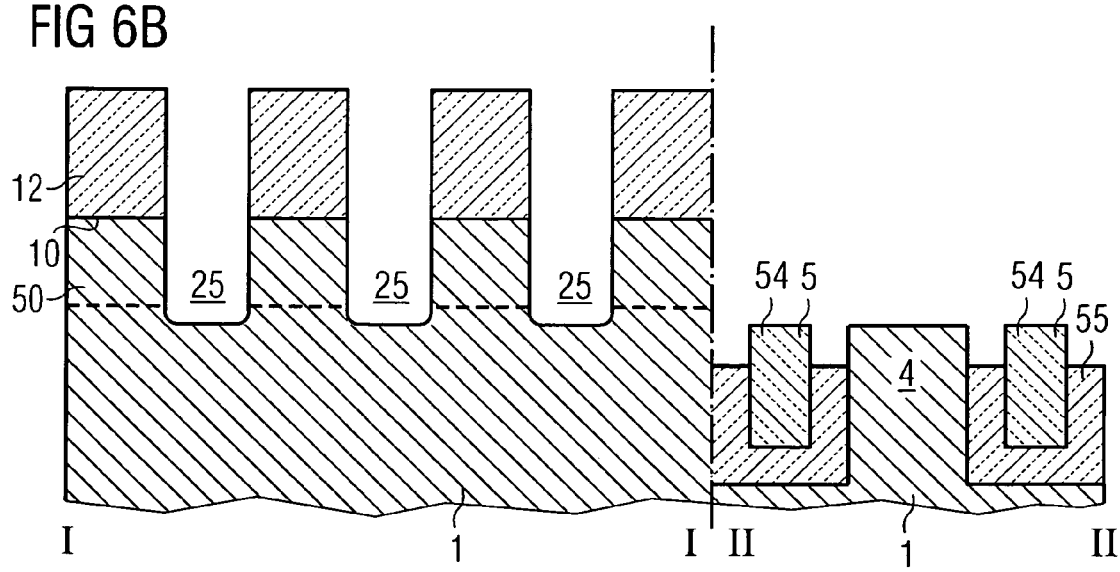

Thereafter, the material present in the isolation trenches 5 is further recessed so as to form the fin-FET, in which the channel is enclosed at three sides thereof by the gate electrode. Optionally, this step may be omitted. This may in particular be the case if the former etching step was slightly selective. For example, if the material present in the isolation trenches 5 has been etched at a higher etching rate than the silicon substrate material, the active area already protrudes from the insulating material of the isolation trenches, as is for example shown in FIGS. 4B and 6A. Moreover, an additional etching step for etching the insulating material in the isolation trenches may be performed. For example, this may be accomplished by etching the silicon dioxide material selectively or slightly selectively with respect to silicon substrate material. The resulting structure is shown in FIG. 6A. As can be seen, the active area portion 4 protrudes from the isolation trenches 5. In the case of a silicon nitride liner as has been explained with reference to FIG. 4A, an etching step may be performed, which etches silicon nitride selectively with respect to silicon and silicon dioxide. As a consequence, the silicon nitride liner 55 is recessed at a portion directly adjacent to the active area 4, whereas the remaining portion of the isolation trench 5 is not recessed. The resulting structure is shown in FIG. 6B. As can be seen, now, the active area 5 protrudes from the adjacent silicon nitride material 55 present in the isolation trenches 5.

FIG. 7 shows different profiles of the gate electrode and the plate-like portions respectively, which may be obtained, if different etching conditions are employed. For example, FIG. 7A shows the case in which the pockets do not extend laterally beyond the width of the gate electrode 27, i.e., the width of the etched gate groove 25. For example, this may be accomplished by an anisotropic etching step.

In addition, FIG. 7B shows the case in which the plate-like portions laterally extend by width w beyond the width of the gate groove and extend downwards from the bottom side of the gate groove by depth d. For example, d may be equal to or approximately equal to w. For example, the profile shown in FIG. 7B may be obtained by an isotropic etching step. Moreover, a combination of the two etching steps may be employed so as to obtain the profile shown in FIG. 7C. As can be seen, the plate-like portions 26 laterally extend by width w and extend in depth by depth d. Nevertheless, d>w. For example, the etching method may comprise two or more steps, comprising in particular isotropic and anisotropic etching steps. Moreover, it is possible to etch the depth of the plate-like portions. Thereafter, the etched profile is measured and the etching parameters of the etching steps to follow are adjusted so as to achieve a desired profile.

Optionally, after defining the plate-line portions, an isotropic etching step may be performed so as to thin the active area 4. In particular, during this etching step, the active area 4 is laterally etched so as to reduce the diameter thereof.

Next, optionally, a sacrificial oxidation step and subsequent stripping step for removing the sacrificial oxide layer may be performed. Thereafter, a thermal oxidation step for growing a gate oxide is performed. The gate oxide 21 is formed in the two grooves 25 (cross-section between I and I) in which later the wordlines will be formed, whereas in the right hand groove 25, in which later an isolation gate line 3 will be formed, a gate dielectric 31 having the same thickness as the gate oxide 21 formed. Thereafter, a metal layer is deposited in the gate grooves 25. Examples of the metal to be used comprise TiN and W. Nevertheless, any other suitable metal conductive material may be used. Thereafter the metal layer is recessed so as to form the high conductivity layer 22 and 32, respectively. In the cross-sectional view between II and II, the stack comprising the gate oxide layer 21/31 and the high conductivity layer 22/32 is deposited. The resulting structure is shown in FIG. 8A.

FIG. 8B shows a cross-sectional view of the resulting structure in a case in which the isolation trenches 5 are filled with a silicon nitride liner and a silicon oxide layer 54. As can be seen, plate-like portions 26 of the gate electrode 27 enclose the channel at three sides thereof. The width of the plate-like portions 26 in the cross-section shown in FIG. 8B between I and II is determined by the thickness of the liner layer 55.

In the next step, a silicon oxide layer 23 and 33 is deposited by generally known methods so as to fill the upper portion of the gate grooves. Thereafter, a CMP (Chemical Mechanical Polishing) step is performed so as to provide a smooth surface. The resulting structure is shown in FIGS. 9A and 9B. For example, as can be taken from FIG. 9A, the upper portion of the gate groove 25 now is filled with the silicon oxide layer 23, 33. As is shown between II and II, the wordline is completely covered by the silicon oxide layer 23/33. Similarly, in FIG. 9B, showing the case in which the silicon nitride liner 55 is present in the isolation trenches 5, the upper gate groove portion is filled with the silicon oxide layer 23, 33. FIG. 9C shows a schematic plan view of the structure shown in FIGS. 9A and 9B, respectively. As can be seen, a plurality of conductive lines 2, 3 are disposed in a first direction, the active areas 4 as well as the isolation trenches 5 extending in a direction which is not perpendicular with respect to the direction of the conductive lines 2, 3.

In the following, the completion of the memory cells will be described, starting from the structure shown in FIG. 9A. Nevertheless, as will be evident to one skilled in the art, the memory cell array may be completed starting from the structure shown in FIG. 9B as well. Moreover, this description is given only by way of example. As is generally known, the transistor which has been described hereinabove, may be implemented in any kind of DRAM memory cell array. Accordingly, the DRAM memory cell array may be completed in any arbitrary manner as is known to one skilled in the art. In particular, the present invention is not restricted to the specific layout described hereinafter.

Figure 10A:
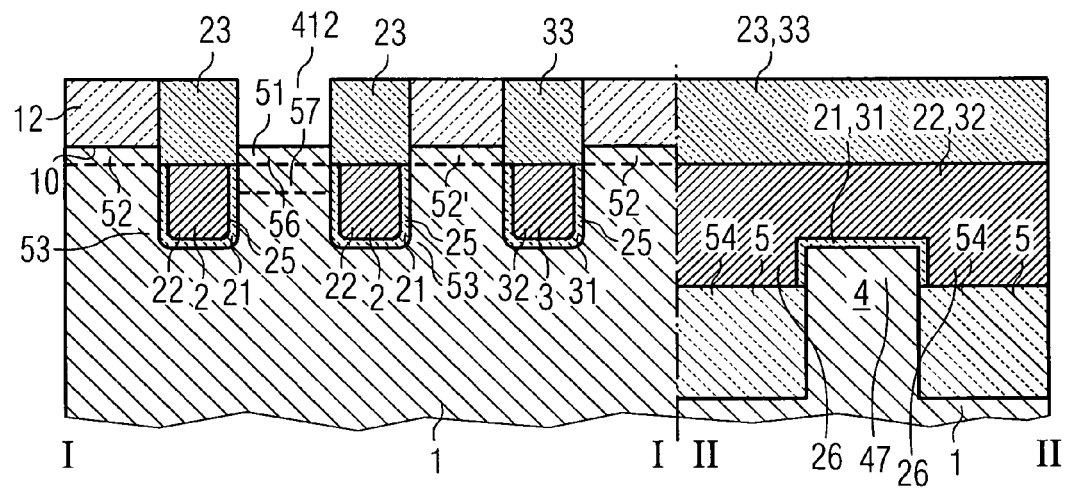
Figure 10B:
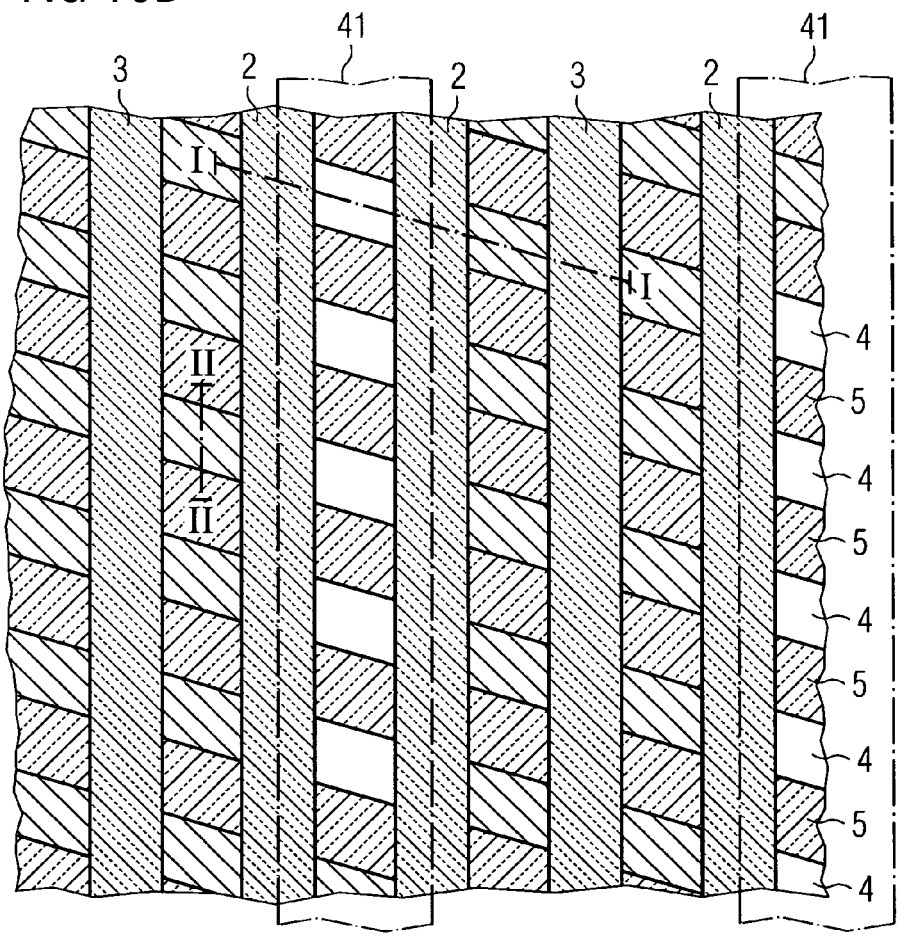

In the next step, the bitline contacts are photolithographically defined. For example as is also shown in FIG. 10B, a block mask 411 having openings in the form of stripes having a width of 2·F may be used. To this end, first, a photoresist layer is applied to the surface of the memory cell array and it is photolithographically patterned using the stripe mask.

In the next step, for opening the bitline contact sections, the hard mask layer 12 is etched, for example by dry etching in the exposed portions. Accordingly, the openings 412 may be formed in the hardmask layer 12. Thereafter, an additional ion implantation step may be performed, so as to further increase the doping concentration of the first source/drain region 51. The resulting structure is shown in FIG. 10A. As can be seen, at predetermined portions, the hardmask layer 12 is removed. Moreover, the first source/drain region 51 now may comprise a lightly doped region 57 and a heavily doped region 56.

Thereafter, a polysilicon layer 7 having a thickness of approximately 20 to 30 nm, optionally, a thin barrier layer 74, a high conductivity layer, such as a tungsten layer 71, having a thickness of approximately 40 nm, a silicon nitride layer 72 as well as a silicon oxide layer 73 are deposited on the resulting surface. The barrier layer 74, which can for example be made of Ti, TiN or WN, prevents the polysilicon layer 7 from interacting with certain kinds of high conductivity layers. In addition, the barrier layer reduces the interface resistance between polysilicon and the high conductivity layer. Thereafter, the bitlines of the memory cell array are photolithographically patterned. To this end, first, a photoresist layer is applied on the deposited layer stack, and, thereafter, it is exposed using a suitable mask having a stripe pattern. Thereafter, the photoresist is developed. Then, an etching step is performed so as to provide the bitline 8 shown in FIG. 11A. As can be seen, now, a bitline stack is in contact with the exposed surface of the first source/drain region 51. In the left hand portion, between I and I as well as between II and II the cross-section of the bitline stack is shown. It is to be noted that the cross-section between II and II is taken perpendicularly with respect to the bitline 8, whereas the cross-section between I and I is taken along an active area line, and, accordingly, is taken obliquely with respect to the bitline 8. Hence, the bitline 8 has a smaller width between II and II then between I and I.

Figure 11A:
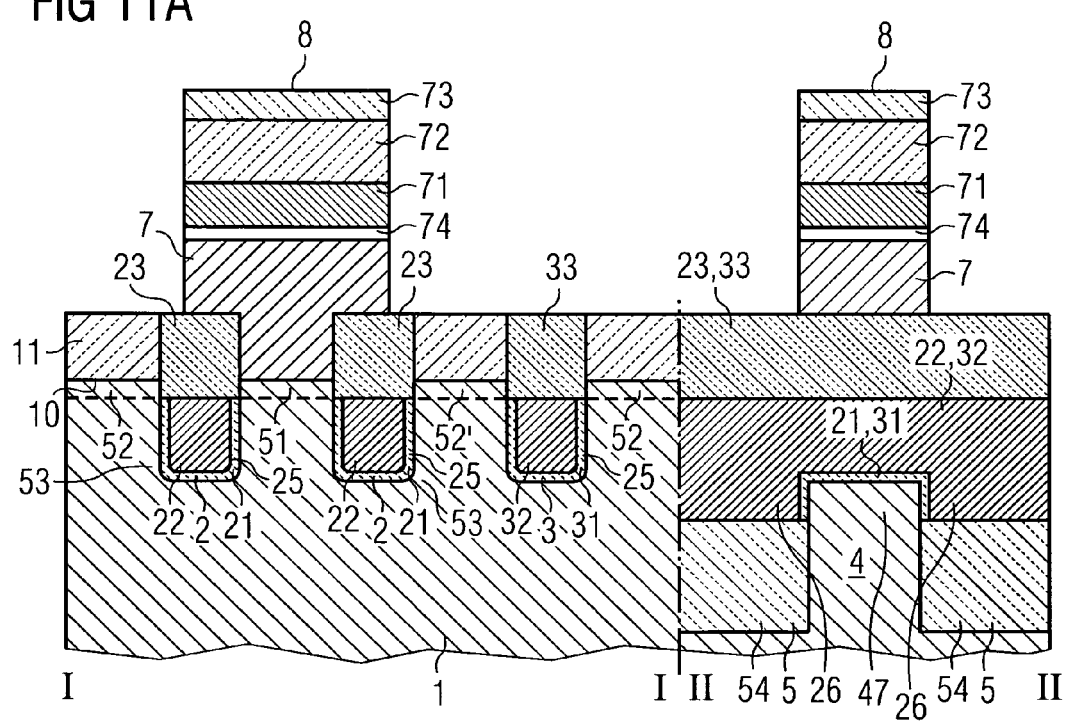
Figure 11B:
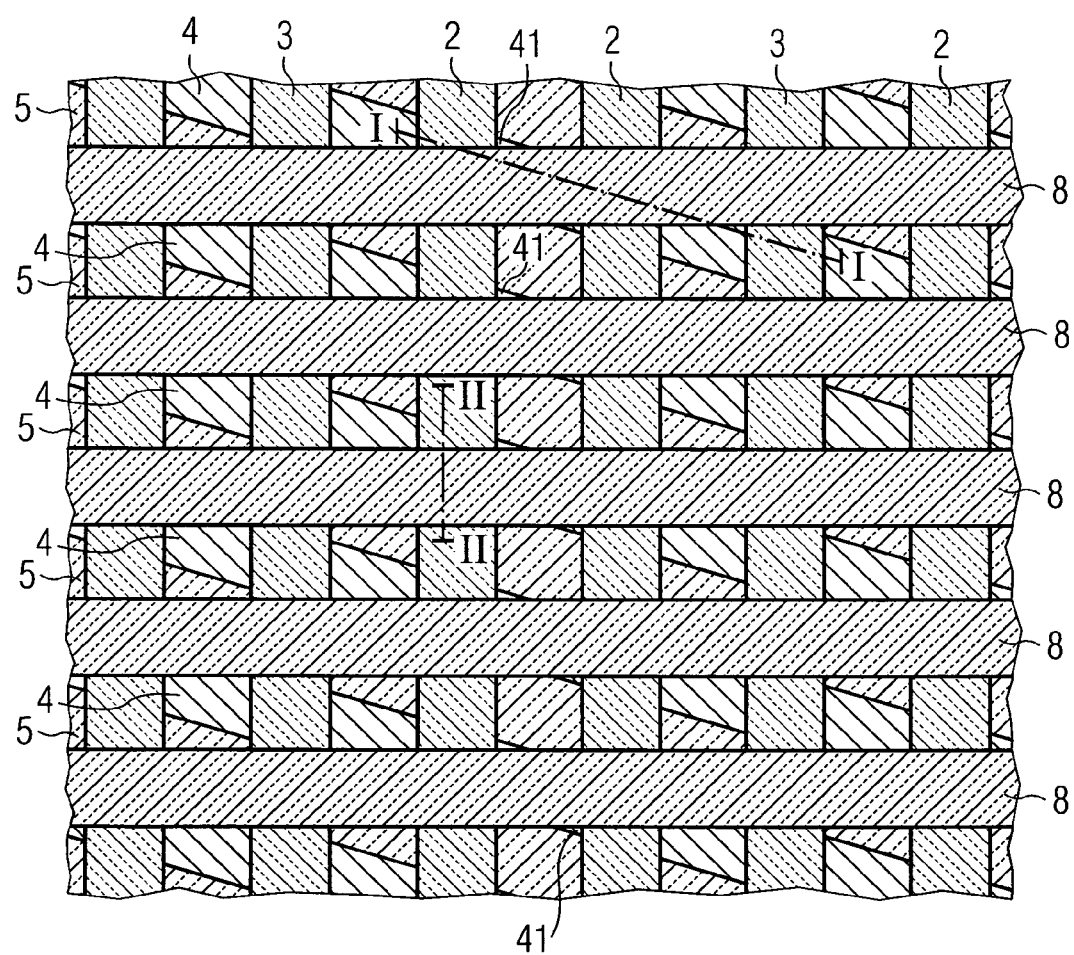
Figure 12:
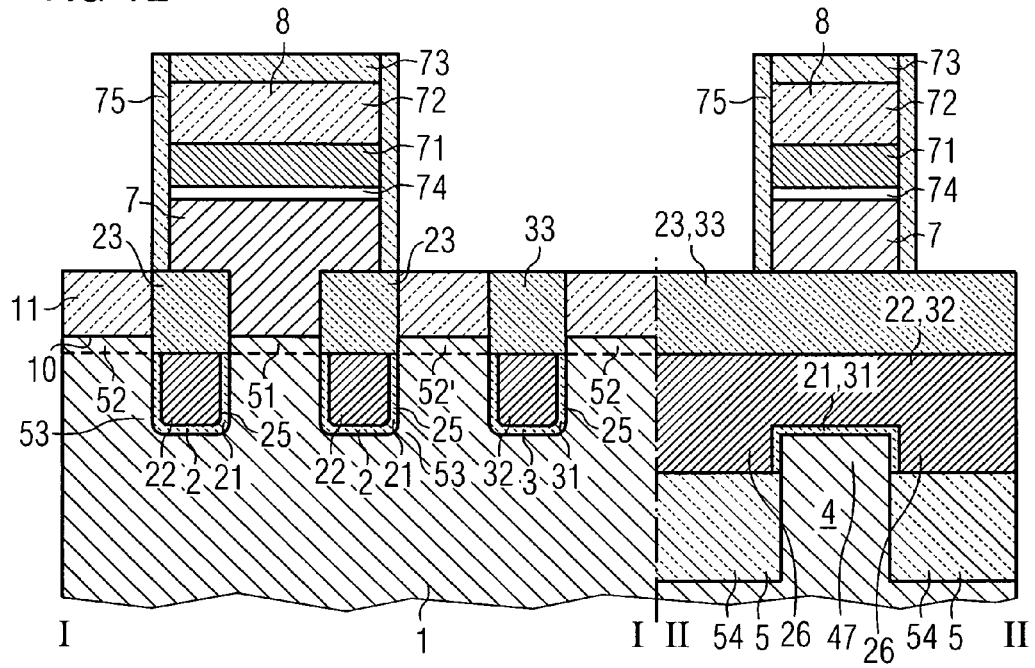

FIG. 11B shows a plan view of the resulting memory cell array. As can be seen from FIG. 11B, the conductive lines 2, 3, represented by the wordlines 2, are arranged in a first direction whereas the bitlines 8 are arranged in a second direction. The first direction is perpendicular to the second direction. Beneath the bitlines, active area lines are arranged intersecting the bitlines at a slanted angle. At the crossing points of the active area lines and the bitlines, bitline contacts 41 are formed.

Figure 13:
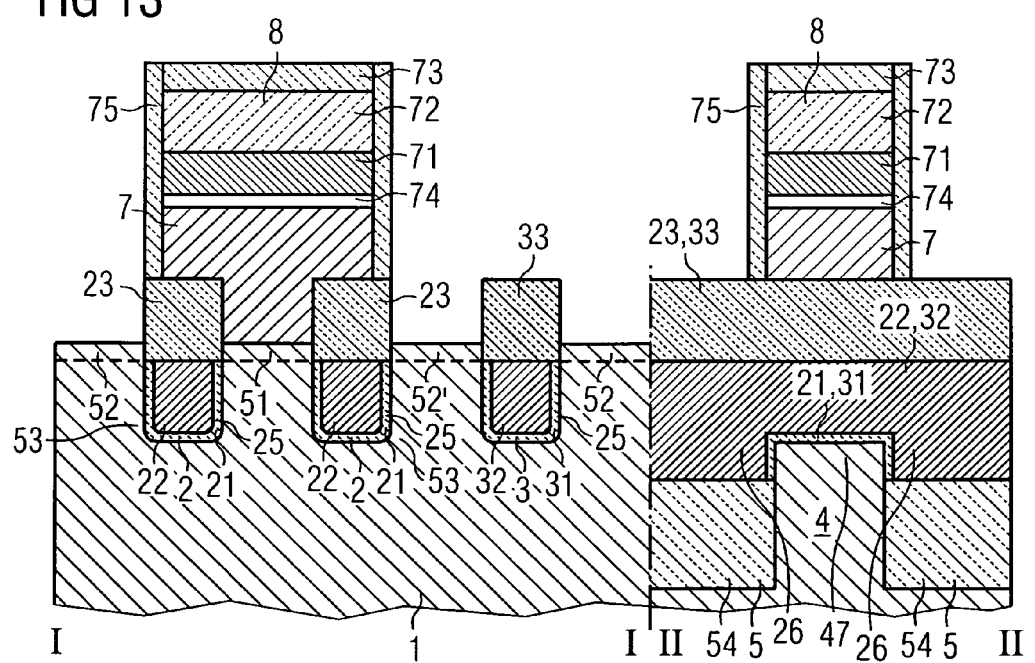

Thereafter, a thin silicon oxide layer 73 (FIG. 12) is deposited as a conformal layer and is anisotropically etched so as to form a silicon oxide spacer 75. The silicon oxide spacer of the bitline provides an electrical isolation between the bitline and the node contact which is to be formed in a later step. The thinner the thickness of the spacer, the larger the overlap capacity between bitline and node contact. In the next step, the hardmask layer 12 is etched by a dry etching step so as to remove all the exposed hardmask layer portions. The resulting structure is shown in FIG. 13.

Figure 14:
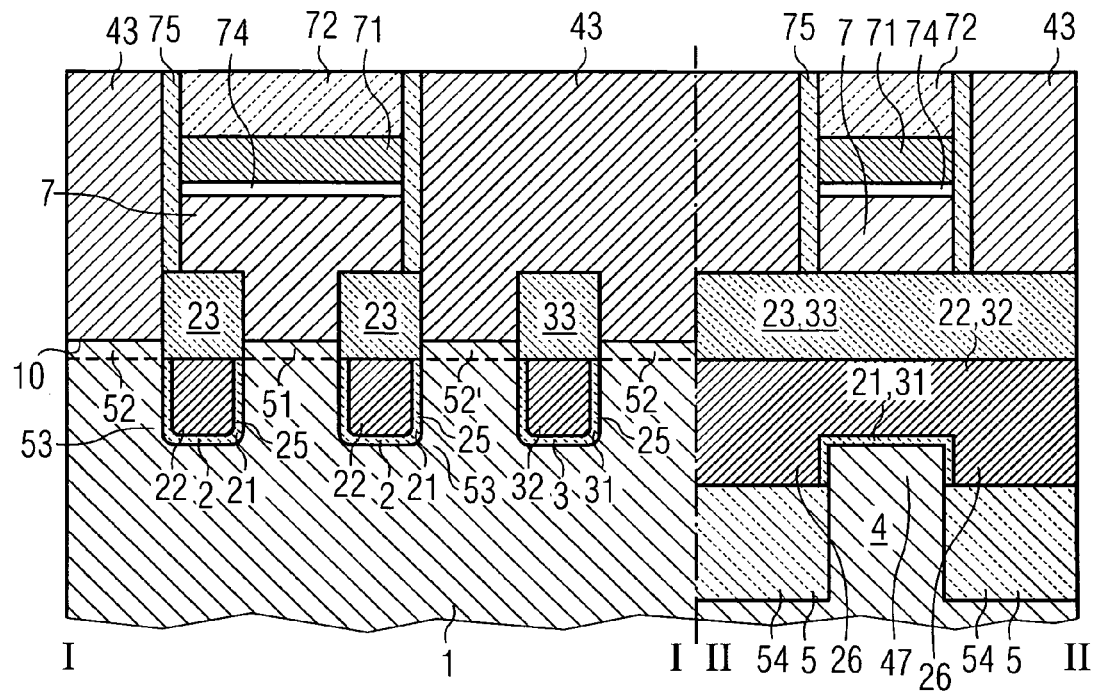

Thereafter, optionally, an implantation step can be performed so as to reduce the contact resistance between the second source/drain region 52, 52' and the capacitor contact to be formed. Thereafter, a polysilicon layer 43 is deposited and the resulting surface is planarized by performing a CMP step. The resulting structure is shown in FIG. 14.

Figure 15:
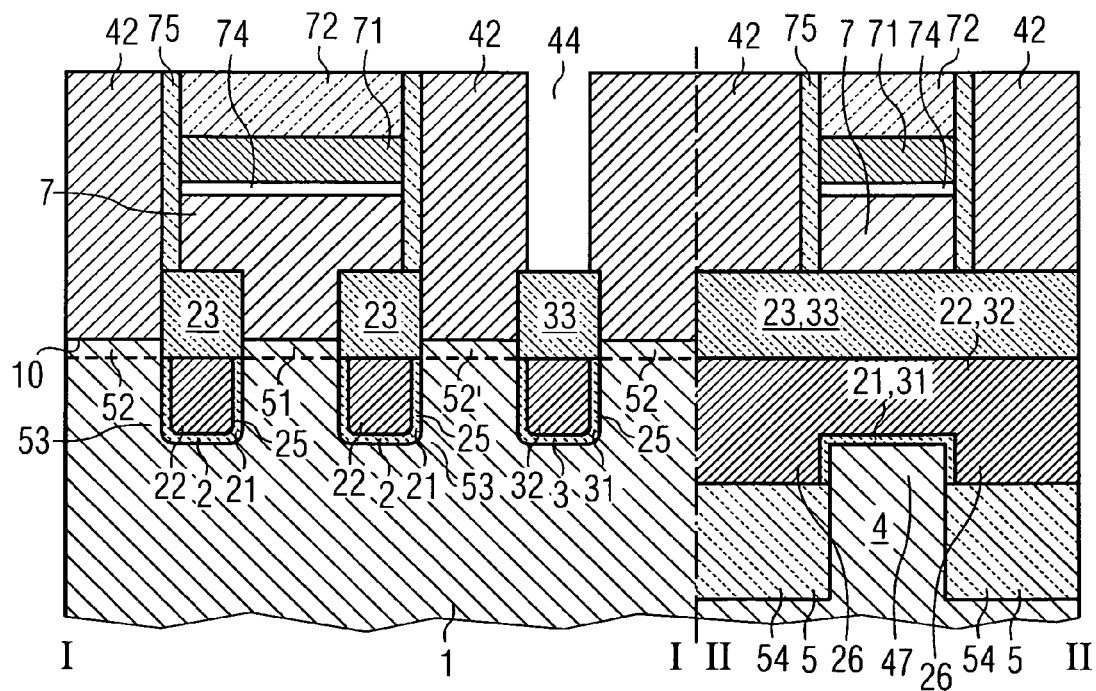

In the next step, optionally, a hard mask layer (not shown) may be deposited so as to define the node contact connecting the second source/drain region and the storage electrode of the storage capacitor to be to be formed later. Thereafter, the capacitor contact is photolithographically defined by using a mask having a stripe pattern. To be more specific, by using a mask having a stripe pattern, isolation grooves 44 laying above the insulating layer 33 of the isolation gate line 3 are defined, so as to electrically isolate adjacent capacitor contacts 42 from each other. The resulting structure is shown in FIG. 15.

In the next step, an isolating material such as a spin-on-glass is deposited so as to fill the isolation grooves 44 and a CMP step is performed so as to provide a smooth surface. Thereafter a silicon nitride layer 45 is deposited so as to provide an electrical isolation of the resulting memory cell array. The resulting structure is shown in FIG. 16A.

Figure 16B:
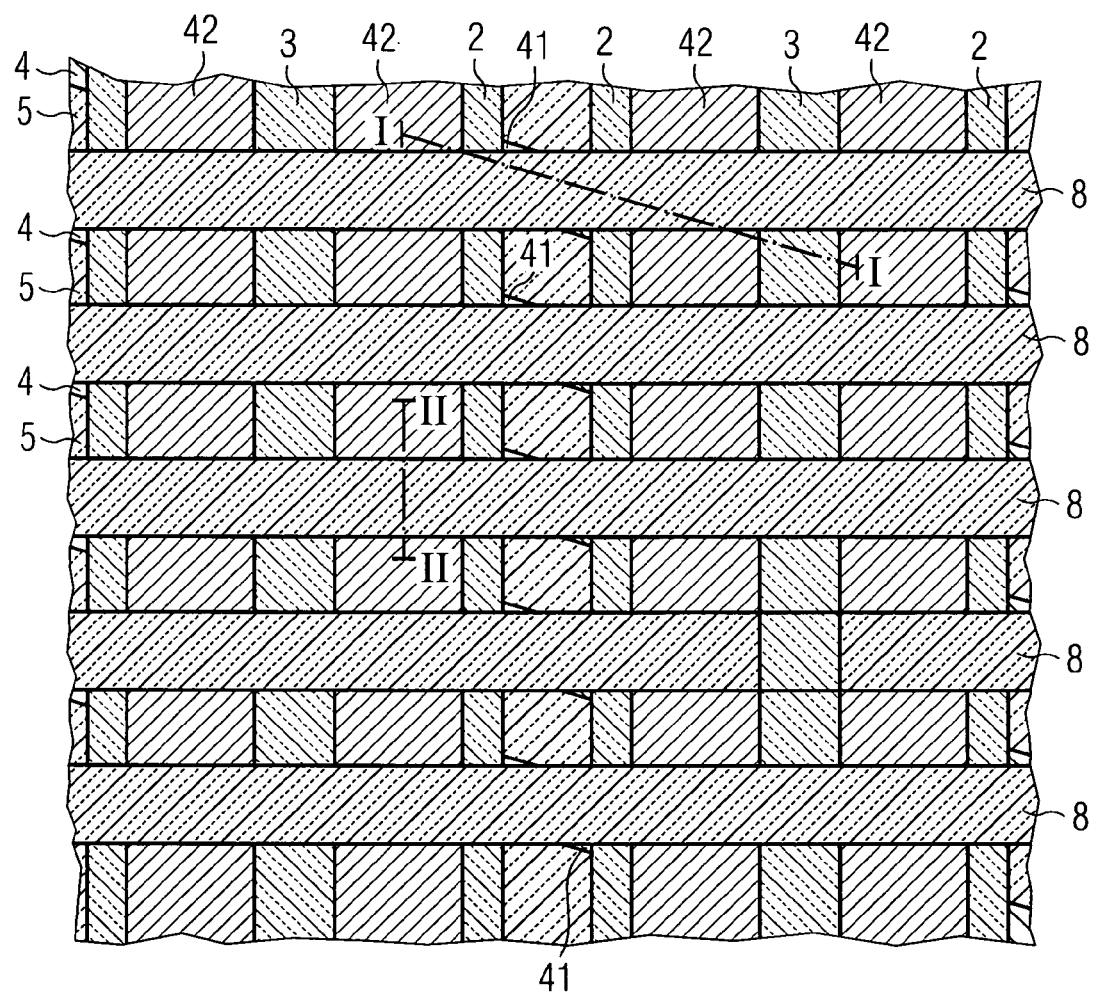
Figure 17B:
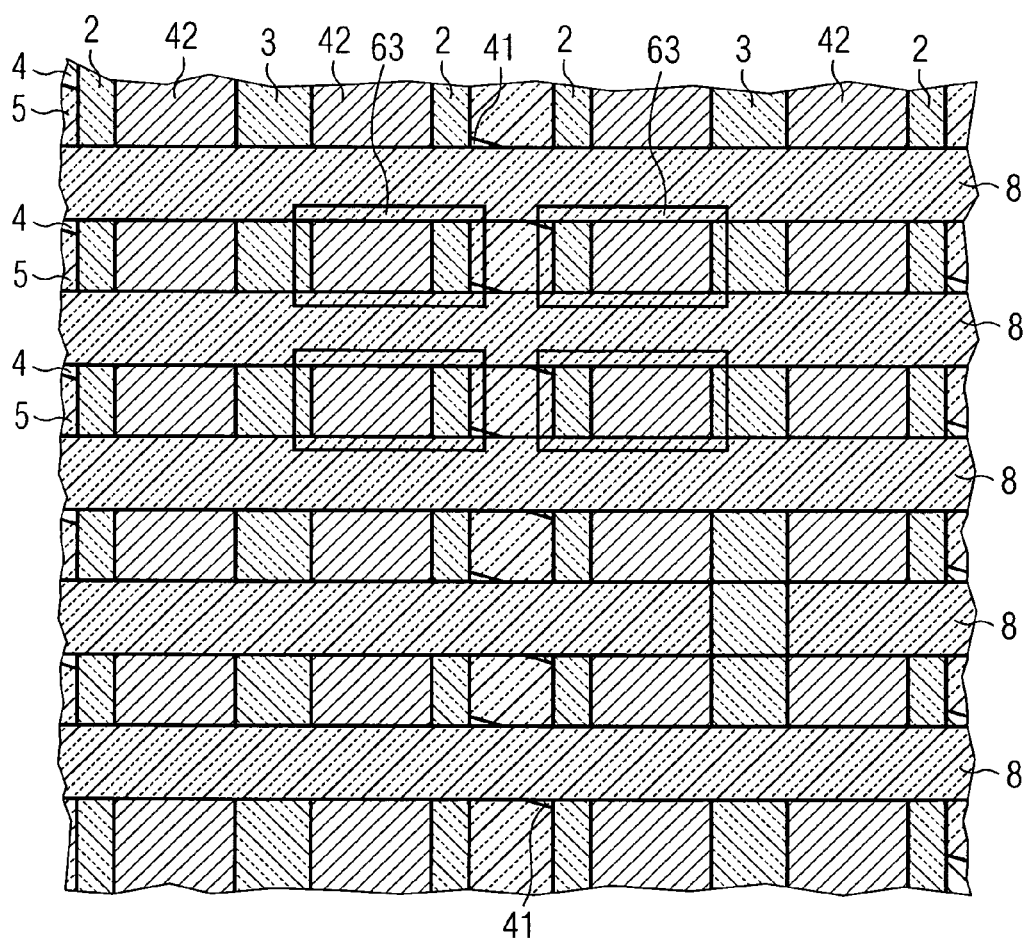

FIG. 16B shows a plan view of the resulting memory cell array after defining the node contacts and performing the CMP step and before depositing the silicon nitride layer 45. As can be seen from FIG. 16B, the node contacts are at all the portions between gate isolation line and word lines between adjacent bit lines 8. In FIG. 17B, a possible layout of the storage capacitors 63 is illustrated. Nevertheless the storage capacitors 63 can be moved by 0.5 F along the direction of the word line, in particular, for obtaining a checkerboard arrangement of the storage capacitors.

In the next steps, the usual steps for completing the memory cell device are performed. In particular, the stacked capacitor is defined by providing a first capacitor electrode 631, a capacitor dielectric 632 as well as the second capacitor electrode 633, the contacts for contacting the peripheral portion are provided and the remaining metallization layers are provided.

FIG. 17A shows a cross-section of the memory cell array after defining an exemplary storage capacitor 63.

According to the present embodiment, the storage capacitor 63 is implemented as a stacked capacitor. Nevertheless, it will be evident to one skilled in the art that any storage element suitable for storing an information can be used instead of the stacked capacitor as shown in FIG. 17A. In particular, alternative storage elements which are disposed above the surface 10 of the semiconductor substrate can be used. The storage capacitor 63 comprises a first capacitor electrode 631, a capacitor dielectric 632 and a second capacitor electrode 633 which can be arranged in the manner shown in FIG. 17A. In particular, the height of the storage capacitor amounts to about 1 to 3 μm. The term "height" refers to the distance of the topmost portion of the first capacitor electrode 631 to the lowest portion of the first capacitor electrodes 631 as seen in the depicted cross-section of FIG. 17A.

The cross-section of the first capacitor electrode in a plane parallel to the substrate surface 10 can be arbitrary. In particular, this cross-section can have an oval, circular or nearly rectangular shape. The capacitor 63 is formed by generally known methods, and the materials for constituting the first and the second capacitor electrodes 631, 633 and the capacitor dielectric 632 can be those as commonly used in the art.

FIG. 17B shows a plan view on the resulting memory cell array. As can be seen, storage capacitors 63 are arranged in a regular manner so as to be connected with the node contacts. According to another embodiment of the present invention, the storage capacitors 63 can be arranged in a different manner, for example, so as to form a checkerboard pattern. In particular, the storage capacitors 63 of neighboring memory cell rows can be moved in a vertical direction by 0.75·F.

In the embodiment shown in FIG. 17A, a first and a second access transistors 61, 62 are disposed adjacent to each other. The first access transistor 61 comprises a first source/drain region 51 and a second source/drain region 52, which are both implemented as n-doped portions, for example. The channel 53 or channel region is formed in the p-doped substrate portion between the first and the second source/drain regions 51, 52, and the conductivity of the channel is controlled by applying an appropriate voltage to the word line 2. The word line 2 comprises a gate dielectric 21 for insulating the word line 2 from the channel 53 and additionally comprises a high conductivity layer 22 such as a metallic layer. In particular, the metallic layer can be made from titanium nitride, tungsten, a combination thereof or other metals as commonly used in the art.

Nevertheless, any other suitable conducting material such as polysilicon can be used as well. An insulating layer 23 may be disposed above the high conductivity layer 22 so as to electrically isolate the word line from the substrate. The second access transistor 62 likewise comprises a first and a second source/drain regions 51, 52' as well as a channel 53 in the p-doped substrate portion between the first and the second source/drain regions. The conductivity of the channel 53 is controlled by the word line 2 having an identical construction to the word line of the first access transistor.

On the right hand portion of the second source/drain region 52' an isolation gate line 3 is disposed. The isolation gate line 3 comprises a gate dielectric 31 as well as a high conductivity layer 32. An insulating layer 33 is disposed above the high conductivity layer 32 so as to accomplish an electric isolation from the substrate and, in particular the adjacent second source/drain regions 52, 52'. An appropriate voltage is usually applied to the isolation gate line 3 so as to prevent an electrical current from flowing between the second source/drain region 52' and the second source/drain region 52 of the access transistor disposed on the right hand side of the second access transistor 62. Accordingly, the isolation gate line 3 acts as an isolation device for isolating neighboring transistors from each other.

Nevertheless, any other isolation device, for example, an isolation groove filled with an insulating material could be as well used so as to electrically isolate adjacent memory cells from each other.

A node contact 42 connects the second source/drain regions 52, 52' with the storage electrode of the storage capacitor 63. In addition, the two access transistors 61, 62 have a common bit line contact 41.

The word lines 2 and isolation gate lines 3 are implemented as buried word lines. Stated more concretely, the top surfaces of the conducting portion of the word line 2 and the isolation gate line 3 are disposed beneath the substrate surface 10. As is shown in FIG. 17A, the second source/drain regions 52, 52' extend to a depth which is approximately equal to the depth of the insulating layer 23. Accordingly, the heavily doped portion of the second source/drain regions 52, 52' which will later be connected with the storage capacitor, are shielded from the gate electrode by this insulating layer 23. In other words, by providing a gate groove in which a word line is disposed, the distance between the gate electrode and the heavily doped portion of the second source/drain region can be increased. By additionally providing an insulating layer, the gate electrode can be isolated from the source/drain regions very effectively. As a consequence, the electric field at the node junction, i.e., the second source/drain region which is to be connected with the storage capacitor, will be reduced. Hence, the retention time of the memory cell, i.e., the time during which an information is recognizably stored in the memory cell, can be increased.

In FIG. 17A, the gate groove extends to a depth of approximately 60 to 80 nm below the substrate surface, the thickness of the high conductivity layer is 40 to 60 nm, and the thickness of the insulating layers 23, 33 is about 60 to 80 nm. Moreover, each of the gate electrodes 27 comprises plate-like portions 26 as has been described with reference to FIG. 1. According to an embodiment, the insulating layer 23, 33 is partly buried, the insulating layer 23, 33 having a portion projecting from the substrate surface 10. This portion projects from the substrate surface 10 essentially to an extent corresponding to the thickness of the hard mask which is used for patterning the gate grooves 25. The projecting portion of the insulating layers 23, 33 provides an electrical isolation between the word line or isolation gate line and the node contact.

As can be further seen from FIG. 17A, the gate grooves 25 extend to a smaller depth than the isolation trenches 5. The gate grooves 25 are formed so as to have rounded corners at the bottom thereof. Stated differently, by employing an isotropical etching step, sharp corners at an intersection of the sidewalls and the bottom face of the gate grooves are rounded. As a consequence, a non-uniform electrical field, which otherwise would occur at these corners, is avoided. As a consequence, an unwanted decrease of the on-current of the transistor is avoided. Accordingly, the channel 53 connecting first and second source/drain regions 51, 52, essentially has the shape of a "U".

The bit line contact can be made of polysilicon in FIG. 17A. The bit line including the bit line contact can be made of a layer stack comprising a polysilicon layer 7 having a thickness of about 20 to 30 nm, optionally, a barrier layer, made of Ti, TiN or WN, for example, a metallic layer 71 having a thickness of about 40 nm, a silicon nitride layer 72 and a silicon dioxide spacer 73. The material of the metallic layer can be an arbitrary metal as commonly used, in particular W, TiN or a metal silicide as commonly used.

By providing a bit line stack comprising a polysilicon layer and a metal layer, the contact resistance can be remarkably reduced.

Figure 18:
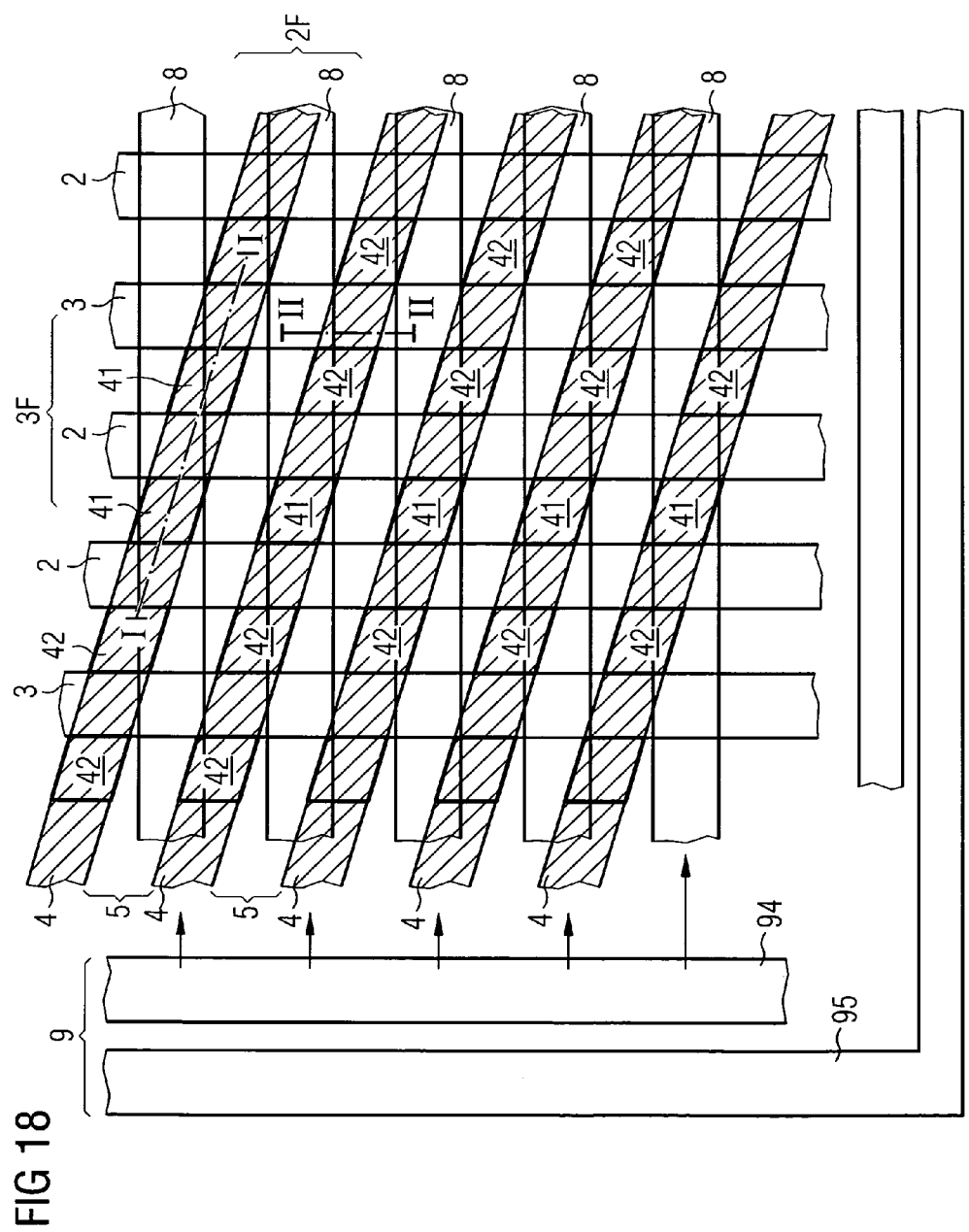
FIG. 18 illustrates an exemplary layout of the memory cell array of the present invention.

FIG. 18 shows a plan view of the resulting memory device comprising the memory cell array 60 and the peripheral portion 9. Usually, the peripheral portion 9 comprises the core circuitry 94 including row drivers and sense amplifiers and other devices for controlling and addressing the individual memory cells, and the support 95 which usually lies outside the core circuitry. In the present disclosure, all parts outside the memory cell array belonging to the memory device are referred to as the peripheral portion 9.

As is shown in FIG. 18, a plurality of bit lines 8 are formed along a horizontal direction whereas a plurality of word lines 2 are arranged in a second direction which is perpendicular to the first direction. In addition, continuous active area lines 4 are disposed at a slanted angle with respect to the bit lines and the word lines, respectively. As can be seen, neighboring active area lines 4 are separated and electrically isolated from each other by isolation trenches 5 which are filled with an isolating material such as silicon dioxide.

Additionally, isolation gate lines 3 are disposed along the second direction. More specifically, one isolation gate line 3 is disposed between pairs of neighboring word lines 2. In particular, the active area lines 4 are formed so that they extend continuously from one edge of the memory cell array to another edge of the memory cell array. It is further preferred, that an angle between the active area lines and the bit lines amount to 10 to 60°. An angle from 10 to 25° is especially preferred. In particular, the angle can amount to approximately 18°.

As can be seen from FIG. 18, two neighboring memory cells 6 share one common bit line contact 41. Accordingly, two node contacts 42 of a bit line 8 are followed by one bit line contact 41 and two neighboring bit line contacts of one active area line 4 are assigned to two different bit lines 8. Hence, a horizontal distance of neighboring bit line contacts preferably amounts to 6·F, whereas a vertical distance of neighboring bit line contacts preferably amounts to 2·F. As a consequence, an angle between the bit line 8 and the active area line 4 of about 18°, in particular 18.43°, is especially preferred, since 18.43° amounts to arctan(⅓).

As a further modification, the continuous active area lines can as well be implemented as angled lines, instead of the straight lines shown in FIG. 18. For example, the active area lines can comprise horizontal sections and slanted sections. As an alternative, the active area lines 4 can be implemented as angled lines having two different angles with respect to the bit lines 8, both angles being different from 0°. As is shown in FIG. 18, one active area line 4 crosses a plurality of bit lines 8, thus forming a plurality of bit line contacts with different bit lines. In particular, neighboring bit line contacts 41, each of the neighboring bit line contacts 41 being connected with one active area line 4, are connected with neighboring bit lines 8.

Figure 19:
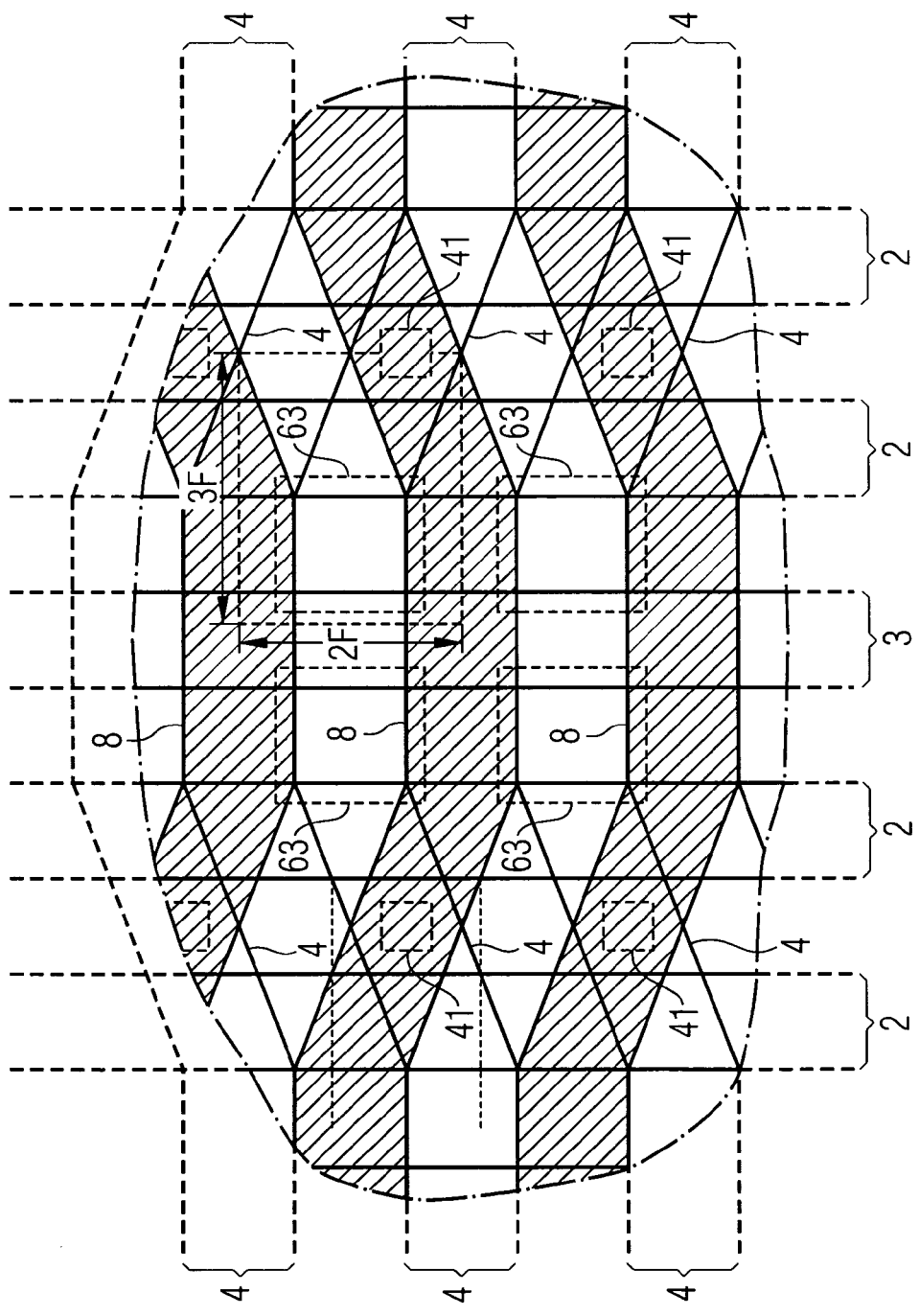
FIG. 19 shows another exemplary layout of the memory cell array comprising a transistor according to an exemplary embodiment of the present invention.

Alternatively, the active area lines 4 and the bit lines can as well be arranged in the manner shown in FIG. 19.

Nevertheless, the present invention is equally applicable to different layouts of memory cells. In particular, the invention is as well applicable to layouts in which the active areas are not formed as continuous lines but as segments comprising two memory cells.

FIG. 20 is a simplified schematic diagram describing a pair of memory cell arrays 60, 60' in accordance with the present invention. The arrays are implemented in an open bit line configuration, each employing memory cells 6, comprising one transistor 61 and one capacitor 63.

The memory arrays 60, 60' are each coupled to respective groups of bit lines 8, 8' and respective groups of word lines 2, 2'. The two groups of bit lines 8, 8' are coupled, one from each of the memory arrays 60, 60', to sense amplifiers 64. The sense amplifiers 64 comprise peripheral circuitry, generally formed outside of peripheries of the memory cell arrays 60, 60'.

In operation, one memory cell 6 is selected, for example, by activating one word line 2. The word line 2 is coupled to the respective gate electrode of a respective one of the transistors 61. The bit line 8 is coupled to the first source/drain region of one of these transistors 61 via the bit line contacts 41. The transistor 61 is turned on, coupling charge stored in the capacitor 63 to the associated bit line 8. The sense amplifier 64 then senses the charge coupled from the capacitor 63 to the bit line 8. The sense amplifier 7 compares that signal to a reference signal, such as the reference charge Qref or a reference signal which is obtained by sensing a corresponding bit line 8', without a voltage being applied to the corresponding word line 2', amplifies the resulting signal and latches the amplified signal from appropriate duration. This allows data represented by the charge stored in the capacitor 63 to be accessed external to the memory arrays 60, 60' and also allows the capacitor 63 to store charge representative of the data from the memory cell 6 back into the memory cell 6.

As will be apparent to one skilled in the art, an alternative array architecture such as a vertically twisted bit line array architecture or a folded bitline configuration which are generally known, can be used as well.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCE SIGNS 1 semiconductor substrate
10 substrate surface
12 hardmask layer
13 hardmask opening
2, 2' wordline
21 gate dielectric
22 high conductivity layer
221 top surface of high conductivity layer
222 bottom surface of high conductivity layer
223 lateral surface of high conductivity layer
23 insulating layer
25 gate groove
26 plate-like portions
27 gate electrode
3 isolation gate line
31 gate dielectric
32 high conductivity layer
33 insulating layer
4 active area
41 bitline contact
411 bitline contact mask opening
412 bitline contact opening
42 node contact
43 polysilicon
44 isolation groove
45 silicon nitride liner
46 thinned active area portion
47 fin portion
48 top side
49a, 49b lateral side
5 isolation trench
50 doped region
50a lightly doped region
50b heavily doped region
51 first source/drain region
52, 52' second source/drain region
52a lightly doped portion
52b heavily doped portion
53 channel
54 silicon dioxide filling
55 silicon nitride liner
56 heavily doped region
57 lightly doped region
6 memory cell
60, 60' memory cell array
61 first access transistor
62 second access transistor
63 storage capacitor
631 first capacitor electrode
632 capacitor dielectric
633 second capacitor electrode
64 sense amplifier
7 polysilicon layer
71 high conductivity layer
72 silicon nitride layer
73 silicon dioxide layer
74 barrier layer
75 spacer
76 polysilicon spacer
8, 8' bitline
9 peripheral portion
94 core circuitry
95 support portion

What is claimed is:

1. An integrated circuit comprising a transistor formed in a semiconductor substrate having a top surface, the transistor comprising:
    first and second source/drain regions, the first and second source/drain regions having a first conductivity type;
    a channel disposed between the first and second source/drain region, the channel having a second conductivity type, the second conductivity type being opposite to the first conductivity type;
    a gate groove defined in the top surface of the semiconductor substrate and comprising an upper and a lower groove portion; and
    a gate electrode for controlling an electrical current flowing in the channel in a first direction between the first and second source/drain regions, wherein the gate electrode is disposed in the lower groove portion of the gate groove and an uppermost surface of the gate electrode is disposed beneath the top surface of the semiconductor substrate, the upper groove portion being filled with an insulating material, wherein, in a cross section perpendicular to the first direction and perpendicular to the top surface of the semiconductor substrate, the gate electrode encloses the channel at a top side and two lateral sides of the channel.

2. The integrated circuit of claim 1, wherein the gate electrode comprises a metal filling in the gate groove.

3. The integrated circuit of claim 1, wherein the first source/drain region is asymmetric with respect to the second source/drain region in a depth direction.

4. The integrated circuit of claim 1, wherein the first source/drain region comprises a different doping concentration than the second source/drain region.

5. The integrated circuit of claim 1, wherein the first source/drain region comprises a first doped portion having a higher doping concentration than a second doped portion forming part of the second source/drain region, the second doped portion being disposed at the same height as the first doped portion.

6. An integrated circuit comprising a transistor formed in a semiconductor substrate having a top surface, the transistor comprising:
 first and second doped regions adjacent to the top surface;
 a channel disposed between the first and second doped regions;
 means for controlling an electrical current flowing in the channel in a first direction between the first and second doped regions, wherein the means for controlling the electrical current is disposed in a groove, the groove being defined in the top surface of the semiconductor substrate, wherein in a cross-section perpendicular to the first direction, the means for controlling the electric current encloses the channel at a top side and two lateral sides of the channel, and wherein a top surface of the means for controlling the electrical current is disposed beneath the top surface of the semiconductor substrate.

7. The integrated circuit of claim 6, wherein the first doped region is asymmetric with respect to the second doped region in a depth direction.

8. The integrated circuit of claim 6, wherein the first doped region comprises a different doping concentration than the second doped region.

9. The integrated circuit of claim 6, wherein the first doped region comprises a first doped portion having a higher doping concentration than a second doped portion forming part of the second doped region, the second doped portion being disposed at the same height as the first doped portion.

10. An integrated circuit comprising a transistor formed in a semiconductor substrate having a top surface, the transistor comprising:
 first and a second source/drain regions;
 a channel being disposed between the first and second source/drain regions;
 a gate groove defined in the top surface of the semiconductor substrate and comprising an upper and a lower groove portion; and
 a gate electrode for controlling an electrical current flowing in the channel in a first direction between the first and second source/drain regions, wherein the gate electrode is disposed in the lower groove portion of the gate groove and an uppermost surface of the gate electrode is disposed beneath the top surface of the semiconductor substrate, the upper groove portion being filled with an insulating material, a boundary between the lower and the upper groove portion being disposed over its entire extent beneath the top surface, wherein, in a cross section perpendicular to the first direction and perpendicular to the top surface, the gate electrode encloses the channel at a top side and two lateral sides of the channel.

11. The integrated circuit of claim 10, wherein the gate electrode comprises a metal filling in the gate groove.

12. The integrated circuit of claim 10, wherein the first source/drain region is asymmetric with respect to the second source/drain region in a depth direction.

13. The integrated circuit of claim 10, wherein the first source/drain region comprises a different doping concentration than the second source/drain region.

14. The integrated circuit of claim 10, wherein the first source/drain region comprises a first doped portion having a higher doping concentration than a second doped portion forming part of the second source/drain region, the second doped portion being disposed at the same height as the first doped portion.

* * * * *